United States Patent
Lee et al.

(10) Patent No.: US 12,268,051 B2
(45) Date of Patent: Apr. 1, 2025

(54) LIGHT EMITTING DISPLAY DEVICE AND MANUFACTURING METHOD THEREOF

(71) Applicant: Samsung Display Co., LTD., Yongin-si (KR)

(72) Inventors: Duk Jin Lee, Suwon-si (KR); Beong-Hun Beon, Hwaseong-si (KR); Hyo Sung Hong, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 625 days.

(21) Appl. No.: 17/564,881

(22) Filed: Dec. 29, 2021

(65) Prior Publication Data
US 2022/0367840 A1    Nov. 17, 2022

(30) Foreign Application Priority Data
May 17, 2021    (KR) .......................... 10-2021-0063442

(51) Int. Cl.
*H01L 51/52*    (2006.01)
*G02B 5/30*    (2006.01)
(Continued)

(52) U.S. Cl.
CPC ........... *H10K 50/868* (2023.02); *G02B 5/305* (2013.01); *G02B 5/3083* (2013.01);
(Continued)

(58) Field of Classification Search
CPC ...... H10K 50/86; H10K 50/868; H10K 59/00; H10K 59/123; H10K 59/8791; H10K 59/8793; G02B 5/3025–3075
See application file for complete search history.

(56) References Cited

U.S. PATENT DOCUMENTS

| 5,327,285 A | * | 7/1994 | Faris | ...................... G02B 30/25 |
| | | | | 348/E5.145 |
| 11,719,872 B2 | * | 8/2023 | Chai | .................... G02B 5/3083 |
| | | | | 359/483.01 |

(Continued)

FOREIGN PATENT DOCUMENTS

| KR | 10-1263697 | 5/2013 |
| KR | 10-2015-0125197 | 11/2015 |

(Continued)

OTHER PUBLICATIONS

Machine translation, Kim, Korean Pat. Pub. No. KR20160026150A, translation date: Aug. 6, 2024, Espacenet, all pages. (Year: 2024).*

(Continued)

*Primary Examiner* — Victoria K. Hall
(74) *Attorney, Agent, or Firm* — KILE PARK REED & HOUTTEMAN PLLC

(57) ABSTRACT

A light emitting display device includes a display panel including a light emitting area and a non-light emitting area; a phase delay layer disposed on the display panel; and a polarizer and an additional polarizer disposed on the phase delay layer. The display panel includes a transistor disposed on a substrate, an organic film overlapping the transistor and including an opening, a first electrode, an emission layer disposed on the first electrode and disposed corresponding to the light emitting area, and a second electrode disposed, the first electrode, the emission layer, and the second electrode form a light emitting diode (LED), the additional polarizer includes a polarization portion overlapping the opening of the organic film in a plan view and a non-polarization portion disposed in a region where the polarization portion is not disposed, and the polarization portion is disposed in a portion of the non-light emitting area.

17 Claims, 21 Drawing Sheets

(51) Int. Cl.
  *H01L 27/12* (2006.01)
  *H01L 27/32* (2006.01)
  *H01L 29/786* (2006.01)
  *H01L 51/56* (2006.01)
  *H10K 50/80* (2023.01)
  *H10K 50/844* (2023.01)
  *H10K 59/123* (2023.01)
  *H10K 59/40* (2023.01)
  *H10K 59/80* (2023.01)
  *H10K 71/00* (2023.01)
  *H10K 59/12* (2023.01)

(52) U.S. Cl.
  CPC .... *H01L 27/1225* (2013.01); *H01L 29/78672* (2013.01); *H01L 29/7869* (2013.01); *H10K 50/844* (2023.02); *H10K 59/123* (2023.02); *H10K 59/40* (2023.02); *H10K 59/8791* (2023.02); *H10K 71/00* (2023.02); *H10K 59/1201* (2023.02); *H10K 59/8723* (2023.02); *H10K 59/8731* (2023.02)

(56) References Cited

U.S. PATENT DOCUMENTS

| | | | | |
|---|---|---|---|---|
| 11,930,658 | B2* | 3/2024 | Chai | H10K 59/353 |
| 11,963,395 | B2* | 4/2024 | Choi | H10K 59/121 |
| 2006/0164571 | A1* | 7/2006 | Broer | G02B 27/288 |
| | | | | 349/98 |
| 2012/0106063 | A1* | 5/2012 | Mathew | G06F 1/1626 |
| | | | | 349/110 |
| 2016/0048055 | A1* | 2/2016 | Dong | G02B 27/28 |
| | | | | 349/1 |
| 2017/0131449 | A1* | 5/2017 | Yaegashi | B29D 11/0073 |
| 2017/0131451 | A1* | 5/2017 | Yaegashi | B32B 27/32 |
| 2018/0173050 | A1* | 6/2018 | Yaegashi | G02F 1/133528 |
| 2020/0103574 | A1* | 4/2020 | Chen | G02B 5/3041 |
| 2020/0212357 | A1* | 7/2020 | Lim | H04N 23/54 |
| 2021/0202588 | A1* | 7/2021 | Cho | H10K 59/84 |
| 2021/0389514 | A1* | 12/2021 | Chai | H10K 59/50 |
| 2022/0020969 | A1* | 1/2022 | Choi | H10K 59/8791 |
| 2022/0085326 | A1* | 3/2022 | Chai | H10K 59/8791 |
| 2023/0142970 | A1* | 5/2023 | Regimbal | G02B 5/3041 |
| | | | | 445/24 |

FOREIGN PATENT DOCUMENTS

| | | | | |
|---|---|---|---|---|
| KR | 10-2015-0125197 A | * | 11/2015 | H01L 51/52 |
| KR | 10-2016-0026150 A | * | 3/2016 | B29C 55/02 |
| KR | 10-2017-0038545 | * | 4/2017 | H01L 27/32 |
| KR | 10-1747736 | | 6/2017 | |
| KR | 10-1753941 | | 7/2017 | |

OTHER PUBLICATIONS

Machine translation, Kim, Korean Pat. Pub. No. KR20150125197A, translation date: Aug. 6, 2024, Espacenet, all pages. (Year: 2024).*
Machine translation, Hwang, Korean Pat. Pub. No. KR20170038545A, translation date: Aug. 6, 2024, Espacenet, all pages (Year: 2024).*

* cited by examiner

| | No polarizer | | Polarizer | |
|---|---|---|---|---|
| | Image | Relative luminance | Image | Relative luminance |
| Originals |  | 14.78 |  | 2.83 |
| Block opening |  | 13.43 (Difference of 1.35) |  | 1.85 (Difference of 0.98) |
| Block opening and light emitting area |  | 12.38 (Difference of 1.05) |  | 1.67 (Difference of 0.18) |

LIGHT EMITTING DISPLAY DEVICE AND MANUFACTURING METHOD THEREOF

CROSS-REFERENCE TO RELATED APPLICATION(S)

This application claims priority to and the benefit of Korean Patent Application No. 10-2021-0063442 under 35 U.S.C. § 119, filed in the Korean Intellectual Property Office on May 17, 2021, the entire contents of which are incorporated herein by reference.

BACKGROUND

1. Technical Field

The disclosure relates to a light emitting display device and a manufacturing method thereof, and more specifically, to a light emitting display device including a polarizer on a front, and a manufacturing method thereof.

2. Description of the Related Art

A light emitting display device is a self-light emitting display device, and displays images when a light emitting diode (LED) emits light.

A liquid crystal display displays images by adjusting a blocking degree of light provided by a light unit, and two polarizers are respectively formed at a top and a bottom as well as a liquid crystal layer.

Therefore, in general, the light emitting display device may display images without the polarizer, differing from the liquid crystal display.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a light emitting display device for forming a polarizer and an additional polarizer on a front, and a manufacturing method thereof.

An embodiment provides a light emitting display device including: a display panel including a light emitting area and a non-light emitting area; a phase delay layer disposed on an upper portion of the display panel; and a polarizer and an additional polarizer disposed on an upper portion of the phase delay layer, wherein the display panel includes a transistor disposed on a substrate, an organic film overlapping the transistor and including an opening, a first electrode disposed on the organic film, an emission layer disposed on the first electrode and disposed corresponding to the light emitting area, and a second electrode disposed on the emission layer, the first electrode, the emission layer, and the second electrode form a light emitting diode (LED), the additional polarizer includes a polarization portion overlapping the opening of the organic film in a plan view and a non-polarization portion disposed in a region where the polarization portion is not disposed, and the polarization portion is disposed in a portion of the non-light emitting area.

The first electrode may be electrically connected to the transistor through the opening of the organic film.

The display panel may include an opening area, in which the opening of the organic film is formed, and a non-opening area, in which the opening of the organic film is not formed, and the polarization portion may overlap at least part of the opening area in a plan view.

The non-opening area may include the light emitting area.

The display panel may further include an additional organic film disposed on a lower portion of the organic film and having an opening included in the opening area, and a connecting member disposed in the opening of the additional organic film to electrically connect the first electrode to the transistor.

The transistor may be a driving transistor applying an output current to the light emitting diode (LED).

The driving transistor may include a polycrystalline semiconductor.

The display panel may further include: a second transistor transmitting a data voltage to an input-side electrode of the driving transistor; and a third transistor electrically connecting a gate electrode of the driving transistor and an output-side electrode of the driving transistor.

The second transistor may include a polycrystalline semiconductor, and the third transistor may include an oxide semiconductor.

The additional polarizer may be disposed on an upper portion of the phase delay layer, and the polarizer may be disposed on the additional polarizer.

The polarizer may be disposed on an upper portion of the phase delay layer, and the additional polarizer may be disposed on the polarizer.

The polarization portion may have an island shape, an extended shape extending in a direction, a zigzag shape, or a protruded shape, and the island shape may have a polygonal shape, a circular shape, or a quadrangular shape.

The phase delay layer may include a $\lambda/4$ plate, and the $\lambda/4$ plate may have a delay axis intersecting an absorption axis of the polarizer or an absorption axis of the polarization portion at about 45 degrees.

The phase delay layer may include a $\lambda/4$ plate and a $\lambda/2$ plate, the $\lambda/4$ plate may have a delay axis intersecting an absorption axis of the polarizer or an absorption axis of the polarization portion at an angle equal to or greater than about 70 degrees and equal to or less than about 80 degrees, and the $\lambda/2$ plate may have a delay axis intersecting the absorption axis of the polarizer or the absorption axis of the polarization portion at an angle equal to or greater than about 10 degrees and equal to or less than about 20 degrees.

The polarizer may include: a PVA (polyvinyl alcohol) layer in which PVA-based molecular chains are aligned in a direction to have a polarization characteristic; and a triacetyl cellulose (TAC) film disposed on sides of the PVA layer.

The display panel may further include an encapsulation layer overlapping the transistor and the light emitting diode (LED), and the encapsulation layer may include triple layers formed by sequentially stacking a first inorganic encapsulation layer, an organic encapsulation layer, and a second inorganic encapsulation layer or may be made of a glass encapsulation layer.

The display panel may further include a touch screen part disposed on the encapsulation layer and sensing a touch event.

Another embodiment provides a method for manufacturing a light emitting display device, including elongating a polyvinyl alcohol-based material in a direction to form a PVA layer having a polarization characteristic; removing the polarization characteristic from a portion of the PVA layer; and attaching the polarization portion to an opening area of a display panel.

The removing of the polarization characteristic may include masking another portion of the PVA layer on which the polarization portion will be formed; and irradiating laser beams on the PVA layer or wiping the PVA layer by use of a solution to remove the polarization characteristic from the portion of the PVA layer.

The display panel may include an organic film including an opening through which a first electrode of a light emitting diode (LED) is electrically connected to a transistor providing a current to the light emitting diode (LED), and the opening of the organic film may be formed in the opening area.

According to the embodiments, the polarizer and the additional polarizer may be formed on the front of the light emitting display device to prevent the reflection of the external light, and the external light may be invisible to a user. The additional polarizer may be formed on the portion of the non-light emitting area, which overlaps, in a plan view, the opening of the organic film positioned under the anode. Thus, a size of the region covered by the additional polarizer may be minimized, and luminance of the light displayed by the light emitting display device may not be reduced, while the reflection of the external light from the front may be invisible to a user.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
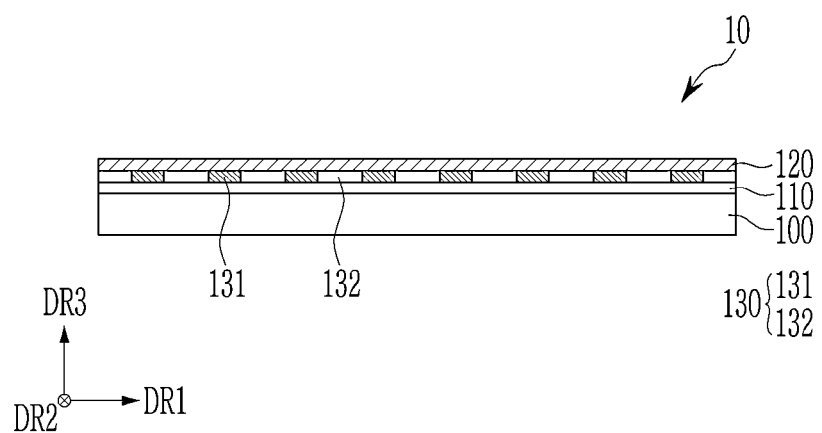
FIG. 1 shows a schematic cross-sectional view of a light emitting display device according to an embodiment.

Some of the embodiments will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that are irrelevant to the description will be omitted to clearly describe the present invention, and the same elements will be designated by the same reference numerals throughout the specification.

The size and thickness of each configuration shown in the drawings are arbitrarily shown for better understanding and ease of description, but the disclosure is not limited thereto. In the drawings, the thickness of layers, films, panels, regions, etc., may be enlarged for clarity. The thicknesses of some layers and areas may be exaggerated for convenience of explanation.

When a layer, film, region, substrate, or area, is referred to as being "on" another layer, film, region, substrate, or area, it may be directly on the other film, region, substrate, or area, or intervening films, regions, substrates, or areas, may be present therebetween. In contrast, when a layer, film, region, substrate, or area, is referred to as being "directly on" another layer, film, region, substrate, or area, may be absent therebetween. Further, when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the term "comprise," "comprising," "includes," and/or "including" are used in the specification, they or it may specify the presence of stated features, integers, steps, operations, elements and/or components, but do not preclude the presence or addition of other features, integers, steps, operations, elements, components, and/or any combination thereof.

Further, in the specification, the phrase "in a plan view" means when an object portion is viewed from above, and the phrase "in a cross-sectional view" means when a cross-section taken by vertically cutting an object portion is viewed from the side.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

A light emitting display device 10 according to an embodiment is provided below with reference to FIG. 1.

FIG. 1 shows a schematic cross-sectional view of a light emitting display device according to an embodiment.

The light emitting display device 10 according to an embodiment may include a display panel 100, a phase delay layer 110 (e.g. a phase retardation layer), an additional polarizer 130, and a polarizer 120.

The display panel 100 may include pixels. Each of the pixels may include a light emitting diode (LED) and transistors for supplying a driving current to the light emitting diode (LED) to emit light. The transistors may include a driving transistor for outputting a driving current to be transmitted to the light emitting diode (LED) and switching transistors. The pixel may further include a capacitor. The structure of the pixel may have various embodiments, and a detailed structure will be described with reference to FIG. 17 to FIG. 20.

The phase delay layer 110 of the light emitting display device 10 of FIG. 1 may be formed on a front side (an upper side in a third direction DR3) of the display panel 100 where light output from the light emitting diode (LED) emits. The phase delay layer 110 may be attached in a film form to a front of the display panel 100. The phase delay layer 100 may be attached by an adhesive. The phase delay layer 110 may include a λ/4 plate. For example, the phase delay layer 110 may further include a λ/2 plate. The phase delay layer 110 may have a delay axis (e.g. a retardation axis). The phase delay layer 110 may delay phase of light linearly polarized in the delay axis. For example, the delayed amount of the light linearly polarized in the delay axis may be greater than that of light linearly polarized in a direction perpendicular to the delay axis.

Regarding the light emitting display device 10 according to an embodiment described with reference to FIG. 1, the additional polarizer 130 of the light emitting display device 10 of FIG. 1 may be positioned on the phase delay layer 110 (on an upper side in the third direction DR3). The additional polarizer 130 is configured with a polarization portion (or polarization portion) 131 and a non-polarization portion 132. The polarization portion 131 may have an absorption axis. The polarization portion 131 may block (or absorb) light linearly polarized in the absorption axis and transmit light linearly polarized in a direction perpendicular to the absorption axis.

The polarizer 120 of the light emitting display device 10 of FIG. 1 may be positioned on the additional polarizer 130 (on an upper side in the third direction DR3). The polarizer 120 may have an absorption axis. The polarizer 120 may block light linearly polarized in the absorption-axis direction and transmit linearly polarized in a direction perpendicular to the absorption axis. The absorption axis of the polarizer 120 and the absorption axis of the polarization portion 131 may be perpendicular to each other.

The light emitting display device 10 according to an embodiment described with reference to FIG. 1 will now be described with reference to FIG. 2.

Figure 2:
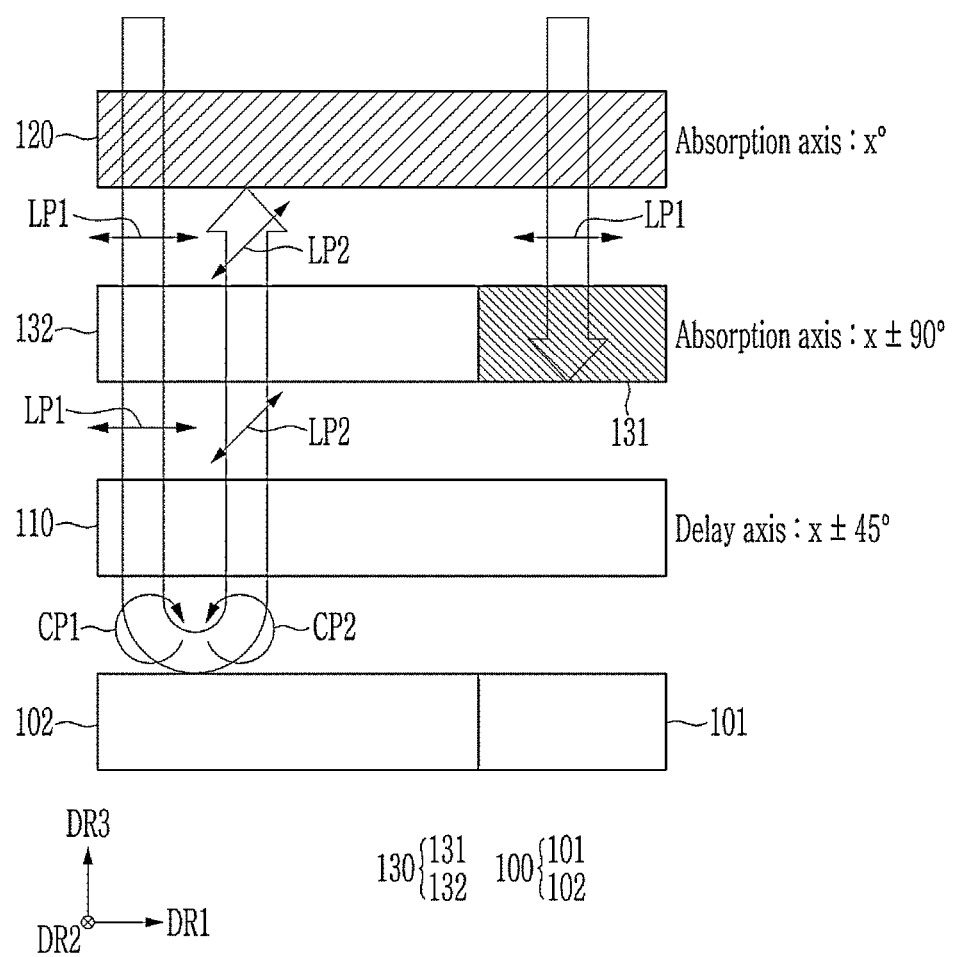
FIG. 2 shows a schematic cross-sectional view of the light emitting display device according to an embodiment described with reference to FIG. 1, FIGS. 3 and 4 show schematic enlarged plan views of light emitting display devices according to embodiments.

FIG. 2 shows a schematic cross-sectional view of a light emitting display device according to an embodiment described with reference to FIG. 1.

In FIG. 2, directions of the absorption axes and the delay axis and optical characteristics of external light incident into the light emitting display device 10 (e.g., refer to FIG. 1) are shown.

Referring to FIG. 2, the absorption axis of the polarizer 120 of the light emitting display device 10 (e.g., refer to FIG. 1) may have an angle of x degrees from a reference axis, and the angle x may be parallel with the second direction DR2. Therefore, the polarizer 120 may absorb (e.g. block) the light linearly polarized in a direction parallel with the second direction DR2, and transmit the light linearly polarized in a direction parallel with the direction (e.g. the first direction DR1) perpendicular to the second direction DR2.

The polarization portion 131 of the additional polarizer 130 may have an absorption axis of x±90 degrees, and the absorption axis (e.g. the angle of x±90 degrees in FIG. 2) may be parallel to the first direction DR1. Therefore, the polarization portion 131 may absorb (e.g. block) the light linearly polarized in a direction parallel to the first direction DR1, and transmit the light linearly polarized in a direction parallel to the direction (the second direction DR2) that is perpendicular to the first direction DR1.

The non-polarization portion 132 of the additional polarizer 130 may be optically transparent and transmit light while maintaining the polarization characteristic before its transmission. For example, the polarization characteristic of the light transmitting the non-polarization portion 132 may not be changed.

The phase delay layer 110 may have a delay axis of x±45 degrees. The delay axis of the phase delay layer 110 may be between the absorption axis of the polarizer 120 and the absorption axis of the polarization portion 131. The phase delay layer 110 may form 45 degrees with respect to the two absorption axes. The light linearly polarized in the direction parallel to the delay axis of the phase delay layer 110 may be delayed, and the light polarized in the direction perpendicular to the delay axis of the phase delayer layer 110 may not be delayed.

In case that the phase delay layer 110 is a λ/4 plate, the light linearly polarized by the angle of x degrees or x±90 degrees may pass through the phase delay layer 110 and may be converted into circularly polarized light. In another embodiment, the phase delay layer 110 may further include a λ/2 plate disposed on or under the λ/4 plate, and the λ/2 plate may change direction of the circularly polarized light converted by the λ/4 plate into an opposite direction. For example, the phase delay layer 110 may change the left-circular polarized light into a right-circular polarized light or change the right-circular polarized light into the left-circular polarized light.

In FIG. 2, the display panel 100 may be divided into an opening area 101 and a non-opening area 102. The opening area 101 corresponds to an opening formed in an organic film positioned on a lower portion of the light emitting diode (LED) in the opening area 101. The organic film may be positioned under an anode AE1 (e.g., refer to FIG. 15) of the light emitting diode (LED). An upper side of the organic film may contact (e.g. directly contacts) the anode AE1 (e.g., refer to FIG. 15) of the light emitting diode (LED). The anode AE1 (e.g., refer to FIG. 15) of the light emitting diode (LED) may be electrically connected to an electrode or a metallic connector, which may be disposed under the anode AE1 (e.g., refer to FIG. 15), through the opening of the organic film. In another embodiment, another opening where external light is reflected in many times may be positioned in the opening area 101. For example, the external light may be reflected from the opening area 101. The opening of the organic film may be adjacent to the anode AE1 (e.g., refer to FIG. 15) of the light emitting diode (LED), and a distance between the opening of the organic film and the anode AE1 (e.g., refer to FIG. 15) may be smaller than a distance between the opening of the organic film and a substrate SUB (e.g., refer to FIG. 15). For example, the opening area 101 may be positioned in a non-light emitting area, which is explained below.

The non-opening area 102 that is a remaining area of the display panel 100 except the opening area 101 may include a light emitting area and the non-light emitting area. The light emitting diode (LED) may be positioned in the light emitting area, and the opening of the organic film may be positioned in the non-light emitting area.

Referring to FIG. 2, a portion of the external light incident into a portion of the polarizer 120 overlapping the non-opening area 102, which has a polarizing axis parallel with the absorption axis (in the second direction DR2) may be absorbed and blocked by the polarizer 120. A portion (e.g. linearly polarized light LP1) of the external light, which is linearly polarized in a direction (e.g. first direction DR1) perpendicular to the absorption axis may pass through the polarizer 120, and may be incident into the non-polarization portion 132 of the additional polarizer 130. The non-polarization portion 132 may transmit the light incident thereinto without variation, and the linearly polarized light LP1, which is linearly polarized in the first direction DR1, may be incident into the phase delay layer 110. The linearly polarized light LP1, which is linearly polarized in the first direction DR1, may pass through the phase delay layer 110 and may be changed into a first circularly polarized light CP1. The first circularly polarized light CP1 may be reflected from a metal layer positioned in the non-opening area 102 of the display panel 100, and phase of the first circularly polarized light CP1 may be changed by 180 degrees into a second circularly polarized light CP2. For example, the metal layer on which the first circularly polarized light CP1 is reflected may be the uppermost layer of the display panel 100 the third direction DR3, and the organic film may be positioned under the metal layer, and thus, the metal layer may have a planar side.

The reflected second circularly polarized light CP2 may pass through the phase delay layer 110 and may be changed into a linearly polarized light LP2, which is polarized in the second direction DR2. The linearly polarized light LP2 that is linearly polarized in the second direction DR2 may pass through the non-polarization portion 132. The linearly polarized light LP2 having passed through the non-polarization portion 132 may be incident into the polarizer 120. A polarizing axis of the linearly polarized light LP2 may be the same as the absorption-axis of the polarizer 120, and thus, the polarizer 120 may block the linearly polarized light LP2 having passed through the non-polarization portion 132.

A portion of the external light incident into a portion of the polarizer 120 overlapping the opening area 101, which has a polarizing axis parallel with the absorption axis (the second direction DR2) may be absorbed or blocked by the polarizer 120. A portion (e.g. linearly polarized light LP1) of the external light, which is linearly polarized in a direction (e.g. first direction DR1) perpendicular to the absorption axis may pass through the polarizer 120, and may be incident into the polarization portion 131 of the additional polarizer 130. The absorption axis of the additional polarizer 130 may be perpendicular to the absorption axis of the polarizer 120, and thus, the light linearly polarized light LP1 in the first direction DR1 may be absorbed or blocked by the additional polarizer 130. Thus, the polarizer 120 and the additional polarizer 130 may completely absorb or block the portion of the external light incident into the portion of the polarizer 120 overlapping the opening area 101 of the display panel 100.

As mentioned above, the external light may be incident into the portions of the polarizer 120 overlapping the opening area 101 and the non-opening area 102 of the display panel 100, and may be processed by the polarization portion 131 and the non-polarization portion 132 of the additional polarizer 130.

A structure of the polarization portion 131 of the additional polarizer 130 in a plan view is provided below with reference to FIG. 3 and FIG. 4.

Figure 3:
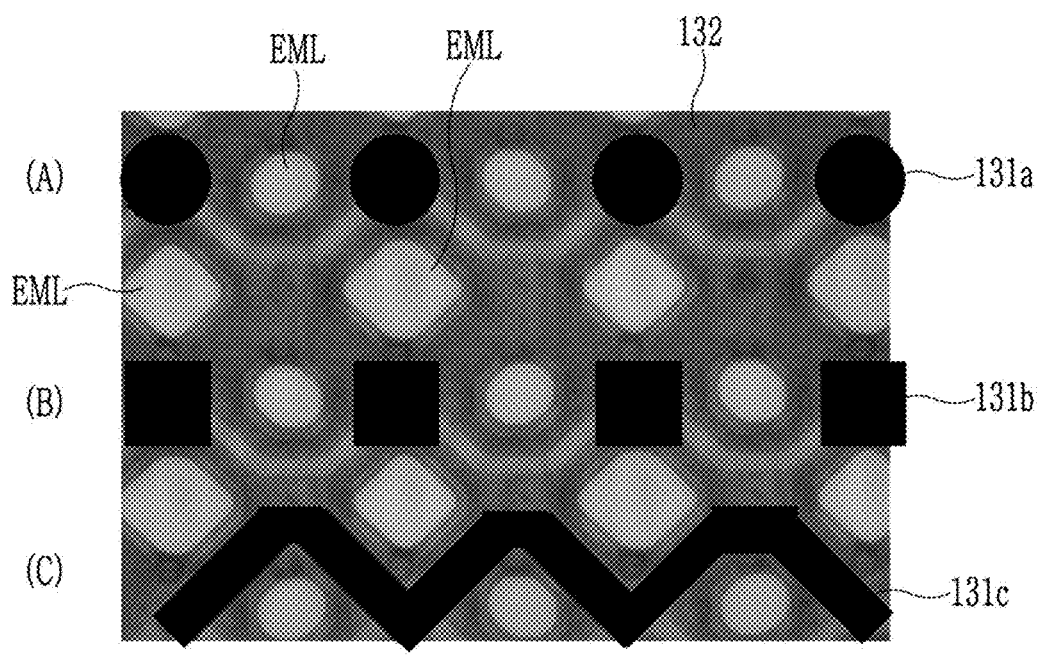
Figure 4:
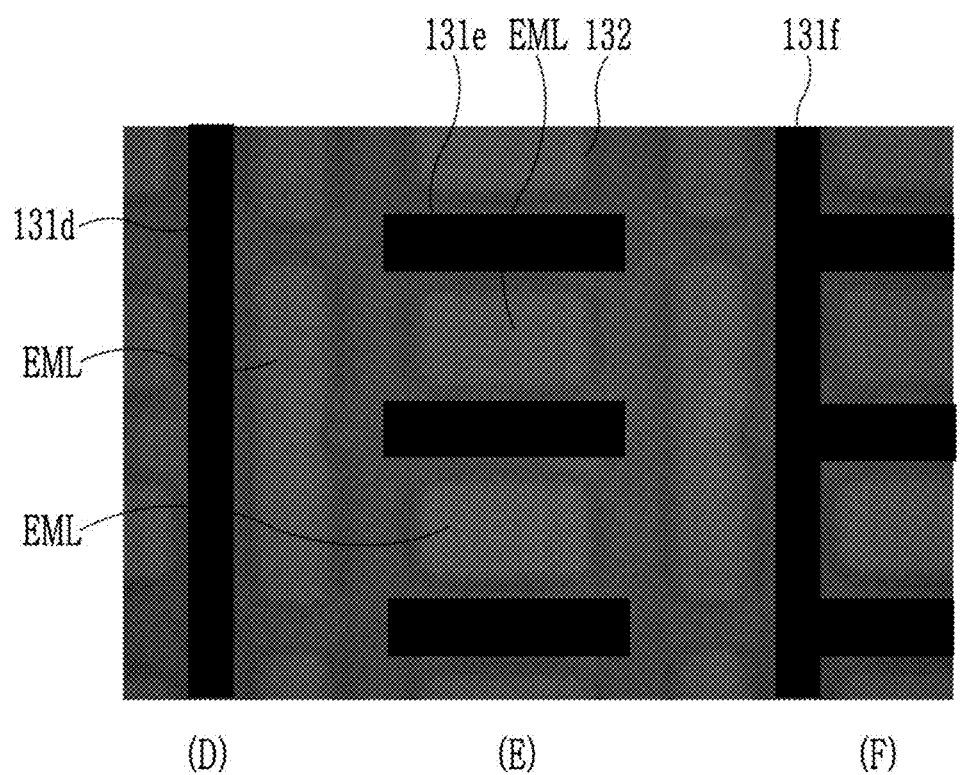

FIGS. 3 and 4 show schematic enlarged plan views of light emitting display devices according to embodiments.

FIG. 3 shows structures ((A), (B), and (C)) of three polarization portions 131 according to an embodiment, and FIG. 4 shows structures ((D), (E), and (F)) of three polarization portions 131 according to an embodiment.

Explanations of three examples ((A), (B), and (C)) of FIG. 3 is provided below.

The examples (A) and (B) of FIG. 3 show polarization portions 131a and 131b in island shapes adjacent to an opening area. The examples (A) and (B) of FIG. 3 show that the polarization portions 131a and 131b may have circular and quadrangular shapes, respectively. In another example, the polarization portions may have various shapes such as a polygonal shape.

The example (C) of FIG. 3 shows a polarization portion 131c alternately connecting adjacent opening areas (e.g., in a zigzag shape).

In FIG. 3, the polarization portions 131a, 131b, and 131c may not overlap an emission layer EML of the light emitting diode (LED) in a plan view, and may be positioned in a region not overlapping (e.g. disposed outside of) the light emitting area. The polarization portions 131a, 131b, and 131c may only be positioned in a portion of the non-light emitting area, in which the emission layer EML is not positioned. In an embodiment, the polarization portions 131a, 131b, and 131c may not be positioned in the entire region of the non-light emitting area, but spaced apart from the emission layer EML in the plan view. Thus, the polarization portions 131a, 131b, and 131c may not overlap the light emitting area during manufacturing processes, although the polarization portions 131a, 131b, and 131c may be misaligned. The polarization portions 131a, 131b, and 131c have a merit of not intentionally reducing the luminance of light. For example, the polarization portions 131a, 131b, and 131c may not decrease luminance of the display device 10 (e.g., refer to FIG. 1) in a side view. In case that the polarization portions 131a, 131b, and 131c are positioned on a path of light, luminance of a display device including the polarizer 120 and the polarization portions 131a, 131b, and 131c may be decreased by about 42% to about 45%. However, the polarization portions 131a, 131b, and 131c may only be positioned in the portion of the non-light emitting area, in which the emission layer EML is not positioned, and thus, the luminance of the display device 10 (e.g., refer to FIG. 1) in the side view may be maximized.

Explanations of three examples ((D), (E), and (F)) of FIG. 4 is provided below.

The example (E) of FIG. 4 shows a polarization portion 131e formed in an island shape adjacent to an opening area. The polarization portion 131e may be formed in a region having a greater size than the polarization portions 131a and 131b of the examples (A) and (B) of FIG. 3. In FIG. 4, a light emitting area positioned in an emission layer EML may extend in a direction, and hence there is a longitudinal space in which the polarization portion 131e may be formed.

The example (D) of FIG. 4 shows a polarization portion 131d extending in a vertical direction between adjacent ones of the emission layers EML. The example (F) of FIG. 4 shows a polarization portion 131f having a combined structure of the examples (D) and (E) of FIG. 4.

In FIG. 4, the polarization portions 131d, 131e, and 131f may not overlap the emission layer EML of the light emitting diode (LED) in a plan view, and may be positioned in a region not overlapping (e.g. disposed outside of) the light emitting area. The polarization portions 131d, 131e, and 131f may only be positioned in a portion of the non-light emitting area, in which the emission layer EML is not positioned. In an embodiment, the polarization portions 131d, 131e, and 131f may not be positioned in the entire region of the non-light emitting area, but spaced apart from the emission layer EML in the plan view. Thus, the polarization portions 131d, 131e, and 131f may not cover or overlap the light emitting area during manufacturing processes although the polarization portions 131a, 131b, and 131c may be misaligned. Thus, the luminance of the display device 10 (e.g., refer to FIG. 1) may be improved although the polarization portions 131d, 131e, and 131f having an absorption axis, which may decrease transmittance.

Referring to FIGS. 3 and 4, the polarization portion 131 may have the island shape having a circular shape, a quadrangular shape, a polygonal shape, or the like. The polarization portion 131 may have a zigzag shape extending in a direction, or may have a linear shape extending in a direction. The polarization portion 131 may further include a structure protruding from a structure extending in a direction. In another embodiment, the polarization portion 131 may further include a ladder shape extending from the example (F) of FIG. 4.

A comparative example in which the polarization portion 131 is not formed in the opening area 101 will now be described with reference to FIG. 5 and FIG. 6. Compared to the example(s) of FIG. 5 and FIG. 6, a function of the polarization portion 131 formed in the opening area 101 according to the embodiment may be clearly found.

Figure 5:
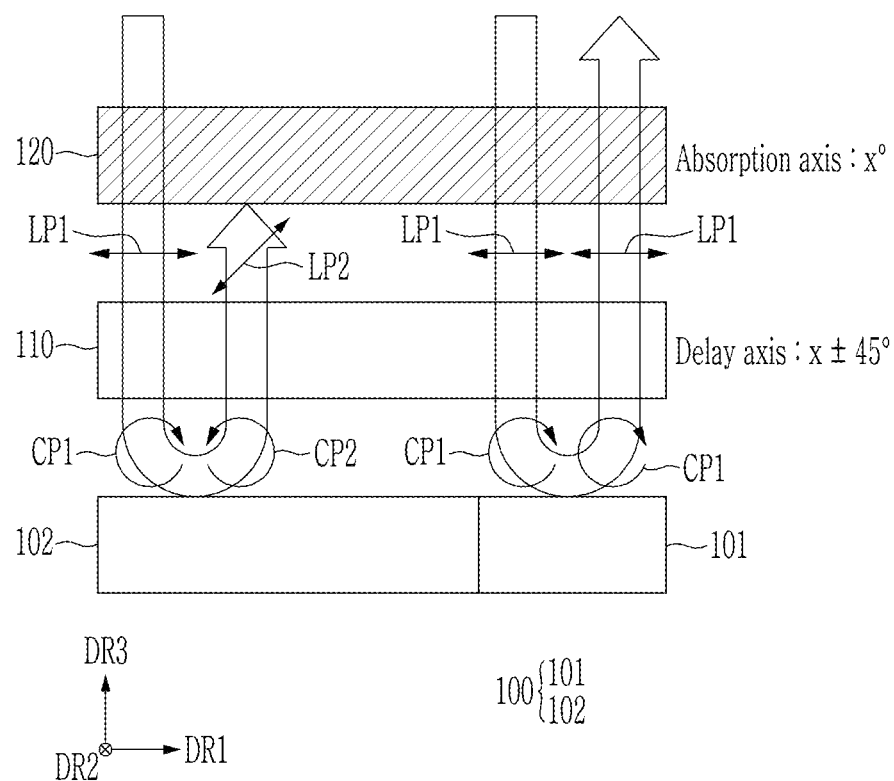
FIG. 5 shows a schematic cross-sectional view of a light emitting display device according to another embodiment.
Figure 6:
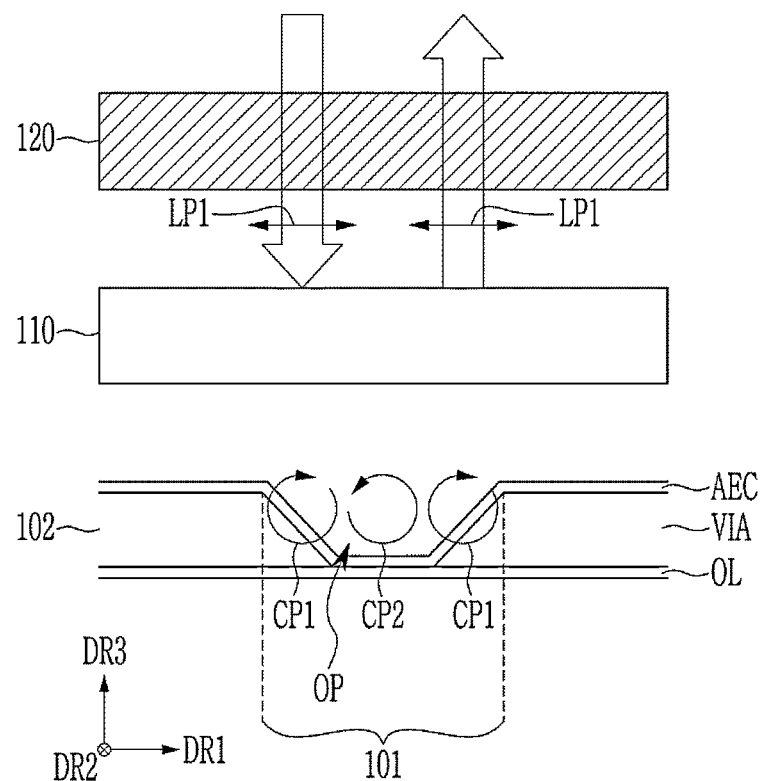
FIG. 6 shows a schematic cross-sectional view of an optical path of an opening area according to another embodiment.

FIG. 5 shows a schematic cross-sectional view of a light emitting display device according to a comparative example, and FIG. 6 shows a schematic cross-sectional view of an optical path of an opening area in a comparative example.

A structure of another embodiment will now be described with reference to FIG. 5.

Referring to FIG. 5, the light emitting display device according to another embodiment includes no additional polarizer 130, and the polarizer 120 and the phase delay layer 110 are formed on the front of the display panel 100.

In another embodiment of FIG. 5, a portion (e.g. linearly polarized light LP1) of an external light incident into a portion of the polarizer 120 overlapping a non-opening area 102 of the display panel 100 may not pass through the polarizer 120, and the light may be invisible to a user as described with reference to FIG. 2. In FIG. 2, the non-polarization portion 132 of the additional polarizer 130 according to the embodiment may be the transparent region and may not change the polarization characteristic.

The light incident into the opening area 101 according to a comparative example described with reference to FIG. 5 will now be described.

Referring to FIG. 5, a portion of the external light incident into a portion of the polarizer 120 overlapping an opening area 101, which has a polarizing axis parallel with the absorption axis (e.g. second direction DR2) may be absorbed and blocked by the polarizer 120. A portion (e.g. linearly polarized light LP1) of the external light incident into the portion of the polarizer 120 overlapping the opening area 101, which has a polarizing axis perpendicular to the absorption axis may pass through the phase delay layer 110. The linearly polarized light LP1 linearly polarized in the first direction DR1 may pass through the phase delay layer 110 and may be changed into a first circularly polarized light CP1.

Referring to FIG. 6, the first circularly polarized light CP1 may be reflected twice from the opening OP positioned in the opening area 101 and may be changed into the first circularly polarized light CP1 again. For example, the opening area 101 may be interposed between adjacent ones of non-opening areas 102. For example, a phase of the first circularly polarized light CP1 may be changed by 360 degrees. For example, in case that the first circularly polarized light CP1 may be reflected once from a metal layer in the third direction DR3, the phase of the reflected first circularly polarized light CP1 may be changed by 180 degrees. However, in FIG. 6, inclined sides opposing or facing each other may be positioned in the opening OP, and the first circularly polarized light CP1 may be reflected from one of the inclined sides in the opening OP to be changed into a second circularly polarized light CP2, and the reflected second circularly polarized light CP2 may be reflected again from another of the inclined sides in the opening OP to be changed into the first circularly polarized light CP1, which is opposite to the inclined side, and thus, the first circularly polarized light CP1 may be reflected twice. In case that the first circularly polarized light CP1 is reflected twice, the phase of the first circularly polarized light CP1 may be changed twice. Each of the reflections may change the phase of the first circularly polarized light CP1 by 180 degrees, and the total amount of the phase change may be 360 degrees. Thus, the first circularly polarized light CP1 may have the same phase as that of the reflected first circularly polarized light CP1, which is reflected twice in the opening OP.

The reflected first circularly polarized light CP1 may pass through the phase delay layer 110 and may be changed into a linearly polarized light LP1 linearly polarized in the first direction DR1. The linearly polarized light LP1 linearly polarized in the first direction DR1 may be incident into the polarizer 120, and the linearly polarized light LP1 may be linearly polarized in the direction perpendicular to the absorption axis of the polarizer 120. Thus, the linearly polarized light LP1 may pass through the polarizer 120, and may be visible to the user. Thus, unwanted light may be visible to the user, and an image display quality of the display device may be deteriorated. Also, the metal pattern disposed inside of the display device may be visible.

However, in an embodiment, the polarization portion 131 having the absorption axis perpendicular to that of the polarizer 120 may be formed in the opening area 101 of the display panel 100, and the external light may be reflected twice from the opening area 101 may be incident into the phase delay layer 110. The reflected light incident into the phase delay layer 110 may be changed into the linearly polarized light linearly polarized in a direction perpendicular to the absorption axis of the polarizer 120, and thus, the linearly polarized light may be absorbed or blocked by the polarization portion 131. Thus, the external light incident into the portion of the polarizer 120 overlapping the non-opening area 102 may be invisible to the outside.

Figure 15:
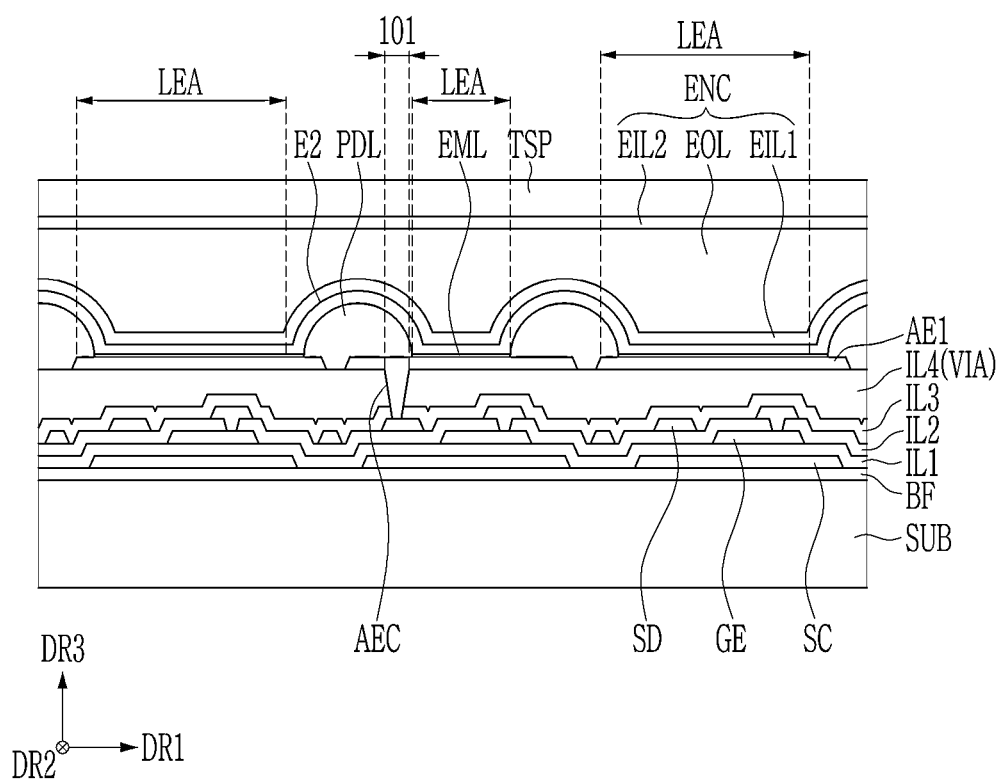
FIGS. 15 and 16 show detailed cross-sectional views of light emitting display panels according to embodiments.

Therefore, according to the embodiment of FIG. 2, the polarization portion 131 of the additional polarizer 130 may only be formed on the portion (i.e., the opening area 101) of the non-light emitting area, and the polarization portion 131 may overlap the opening of the organic film positioned under the anode AE1 (e.g., refer to FIG. 15). Thus, a region blocked by the polarization portion 131 may be minimized, and the light emitting the light emitting diode (LED) may not be blocked by the additional polarizer 130. Therefore, luminance of the light in the front of the display device 10 may be maximized, and the external light may be invisible to the user.

An effect according to the embodiment is provided below with reference to FIGS. 7, 8A, and 8B.

Optical characteristics of external light reflected from various structures is provided below with reference to FIG. 7.

Figure 7:
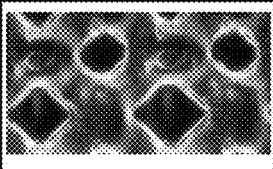
FIG. 7 shows optical characteristics of external lights reflected from display devices according to various embodiments.
Figure 7:
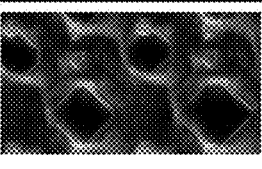
Figure 7:
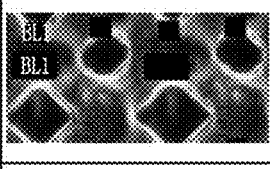
Figure 7:
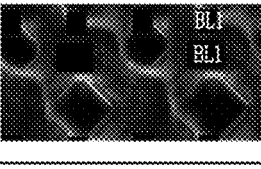
Figure 7:
Figure 7:
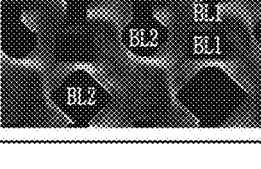

FIG. 7 shows optical characteristics of display devices according to various embodiments.

Referring to FIG. 7, the polarization portions BL1 and BL2 were formed on various positions, and optical characteristics of reflected external lights were photographed, and a display panel without a polarizer was compared with a display panel including a polarizer.

The polarization portions BL1 and BL2 were formed on at least two portions of the display panel. The first polarization portion BL1 overlapped the opening area, and the second polarization portion BL2 overlapped a light emitting area in which the emission layer is positioned.

Relative luminance of the display panel without the polarizer or the polarization portions BL1 and BL2 was about 14.78. Relative luminance of the display panel including the first polarization portion BL1 without the polarizer was reduced to be about 13.43, and the reduced amount was about 1.35 (e.g. 14.78-13.43). Relative luminance of the display panel including the first and second polarization portions BL1 and BL2 was further reduced to be about 12.38, and the reduced amount was about 1.05 (e.g. 13.43-12.38).

Relative luminance of a display panel including the polarizer without the first or second polarization portion BL1 or BL2 was about 2.83, which was desirable compared with the display panels without the polarizer. However, a portion of reflected light was viewed from the outside of the display panel. Relative luminance of a display panel including the polarizer and the first polarization portion BL1 formed in the opening area was reduced to be about 1.85, and the reduced amount was about 0.98 (e.g. 2.83-1.85). Relative luminance of a display panel including the polarizer and the first and second polarization portions BL1 and BL2 was reduced to be about 1.67, and the reduced amount was about 0.18 (e.g. 1.85-1.67).

Figure 8A:
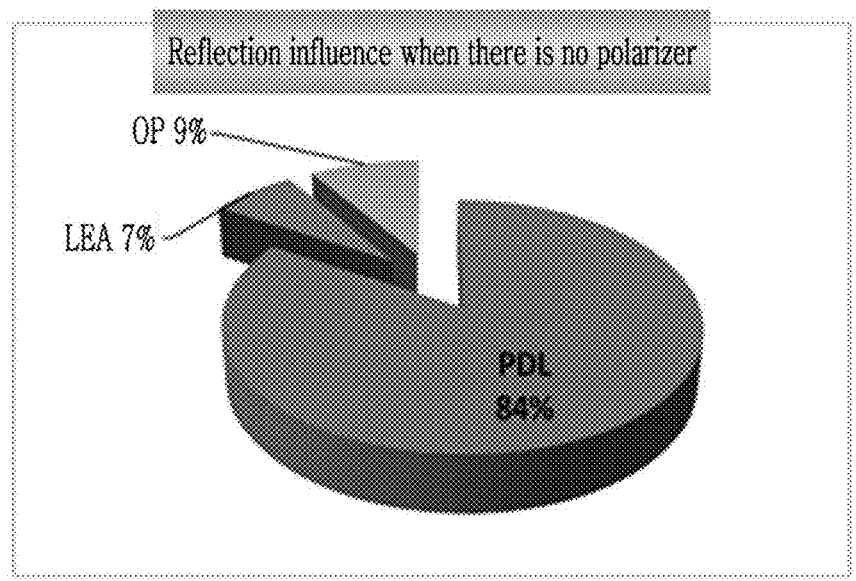
FIGS. 8A and 8B show graphs of reflection influence of the various embodiments of FIG. 7.
Figure 8B:
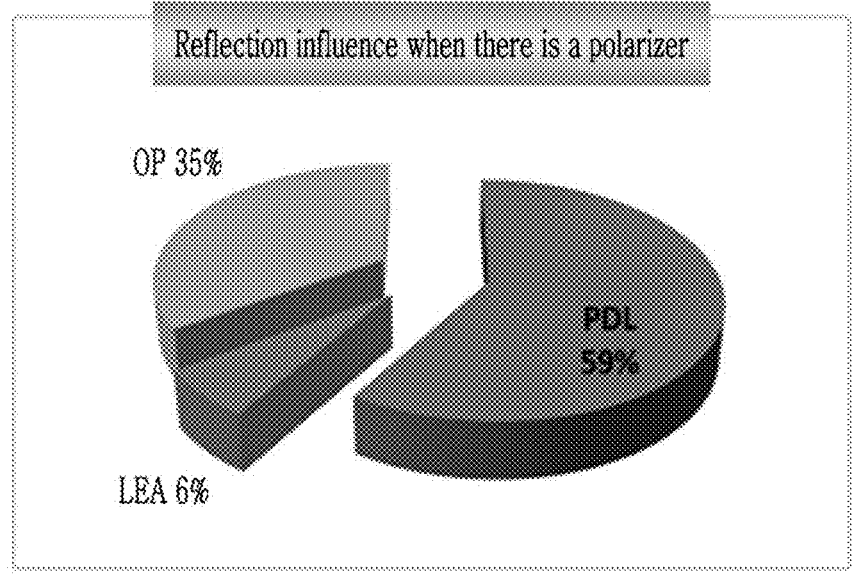

The optical characteristics of the reflected lights was shown with numerical values in schematic diagrams in FIGS. 8A and 8B.

FIGS. 8A and 8B show graphs of reflection influence of the various embodiments of FIG. 7.

Referring to FIG. 8A shows reflection influence of an external light reflected from a display panel without a polarizer, and FIG. 8B shows reflection influence of an external light reflected from a display panel including a polarizer. A reference character PDL may refer to the reflection influence of the external light reflected from a pixel defining layer positioned on a right and a left of an emission layer and a cathode provided on the pixel defining layer. A reference character OP may refer to the reflection influence of the external light reflected from the opening area. A reference character LEA may refer to the reflection influence of the external light reflected from the light emitting area.

Referring to FIG. 8A, 84% of the external light was reflected from the pixel defining layer PDL of the display panel without the polarizer, and the reflection influence of the pixel defining layer PDL was very large. Only 9% of the external light was reflected from the opening area OP of the display panel without the polarizer. Referring again to FIG. 7, the relative luminance of the display panel without the polarizer was increased, and an image display quality was deteriorated.

Referring to FIG. 8B, 35% of the external light was reflected from the opening area OP of the display panel including the polarizer, which was greater than that of the display panel without the polarizer. 59% of the external light was reflected from the pixel defining layer PDL of the display panel. Thus, the polarization portion overlapping the opening area removed 35% of the external light reflected from the opening area OP, and the amount of the external light reflected from the display panel was decreased. Therefore, the image display quality of the display device was improved.

Referring again to FIGS. 7, 8A, and 8B, the display panel including the polarizer and the polarization portions BL1 and BL2 showed the minimum relative luminance. However, the relative luminance of the display panel including the polarizer and the polarization portions BL1 and BL2 was similar to that of the display panel without the second polarization portion BL2. Thus, the effect of the second polarization portion BL2 was negligible, and the light transmittance of the polarization portions BL1 and BL2 of the additional polarizer was about 42% to about 45%. Therefore, the luminance of the display panel including the polarizer and the polarization portions BL1 and BL2 was decreased to deteriorate the image display quality.

Therefore, in the embodiment, the display panel 100 of FIG. 2 may include the polarizer 120 and the polarization portion 131 of the additional polarizer 130, and the polarization portion 131 may be disposed in the opening area 101 outside of the light emitting area. The polarization portion of the additional polarizer 130 may not overlap the light emitting area. The polarization portion 131 of the additional polarizer 130 may not overlap the entire of a non-light emitting area but overlap only a portion of the non-light emitting area, and may be spaced apart from the light emitting area to form a gap therebetween. Thus, the polarization portion 131 of the additional polarizer 130 may not cover (or overlap or block) the light emitting area, although the polarization portion 131 may be misaligned. The polarization portion 131 may not block a path of light, and luminance of the display device 10 (refer to FIG. 9) in a side view may not be decreased.

Another embodiment will be described with reference to FIGS. 9 to 16.

Explanation of an embodiment is provided below with reference to FIGS. 9 and 10.

Figure 9:
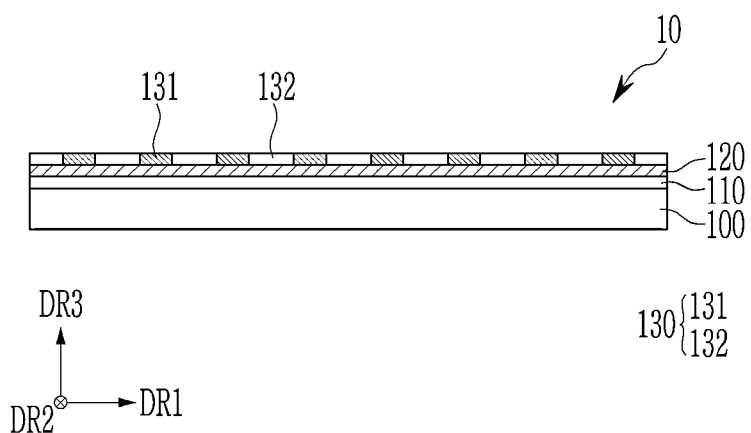
FIG. 9 shows a schematic cross-sectional view of a light emitting display device according to another embodiment.
Figure 10:
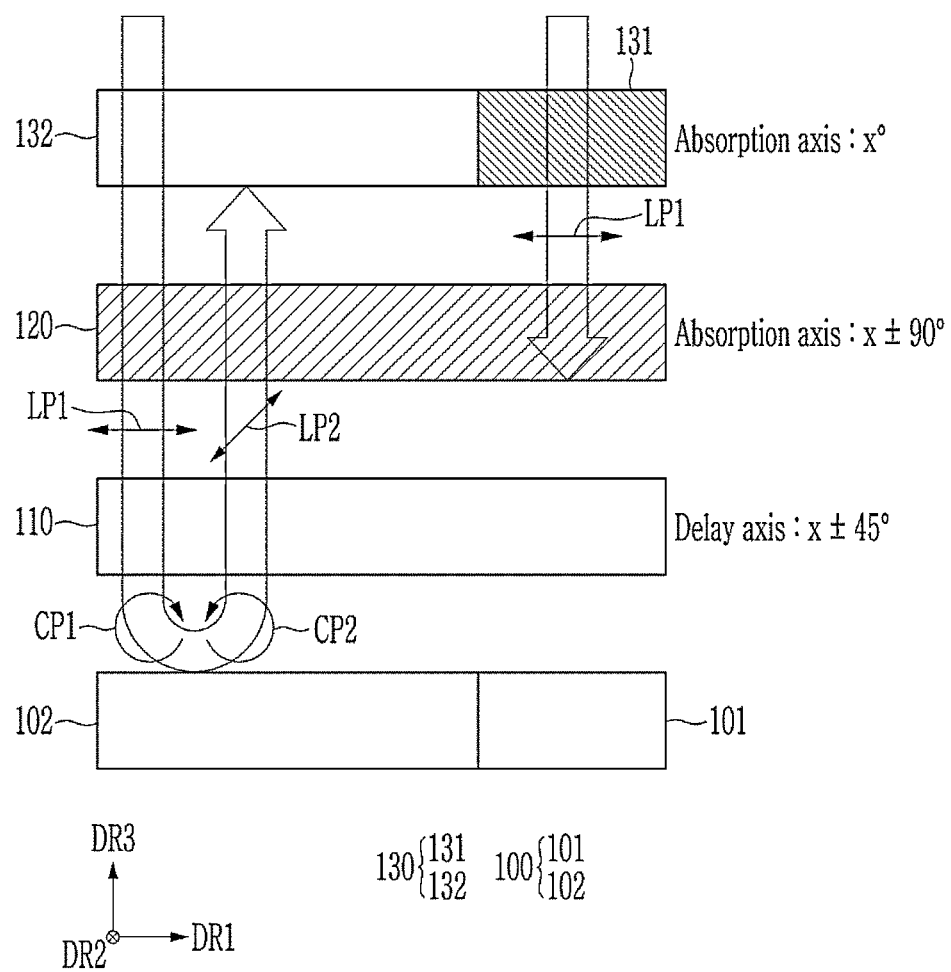
FIG. 10 shows a schematic enlarged cross-sectional view of a portion of the light emitting display device of FIG. 9, FIGS. 11 and 12 show schematic enlarged cross-sectional views of portions of light emitting display devices according to embodiments.

FIG. 9 shows a schematic cross-sectional view of a light emitting display device according to another embodiment, and FIG. 10 shows a schematic enlarged cross-sectional view of a portion of the light emitting display device of FIG. 9.

Referring to FIGS. 9 and 10, the display device according to the embodiment is different from the embodiment of FIGS. 1 and 2 at least in that positions of an additional polarizer 130 and a polarizer 120 are changed. Thus, any repetitive explanation for the same elements will be omitted.

Referring to FIG. 10, a non-polarization portion 132 of the additional polarizer 130 may be positioned on the polarizer 120, and the non-polarization portion 132 may be disposed in a non-opening area 102. Since the non-polarization portion 132 does not change optical characteristics, a polarization characteristic of the display device 10 of FIGS. 9 and 10 may be the same as that of the display device 10 of FIGS. 1 and 2.

An absorption axis (e.g. x degrees) of the polarization portion 131 may be perpendicular to an absorption axis (e.g. x±90 degrees) of the polarizer 120 in the opening area 101, and thus, an external light incident into the display device 10 (refer to FIG. 9) may not pass through a polarization assembly formed by the polarization portion 131 and the polarizer 120. Thus, the external light may not be incident into the opening area 101 of the display panel 10 (refer to FIG. 9). Although a portion of the external light is reflected from the opening area 101 of the display panel 10 (refer to FIG. 9), the reflected light may not pass through polarization assembly formed by the polarization portion 131 and the polarizer 120. Thus, the external light incident into the opening area 101 may be invisible to the user.

Explanation of an embodiment is provided below with reference to FIG. 11 and FIG. 12. The display device according to the embodiments are different from the embodiment of FIGS. 1 and 2 in that sizes of polarization portion 131 positions are changed. Thus, any repetitive explanation for the same elements will be omitted.

Figure 11:
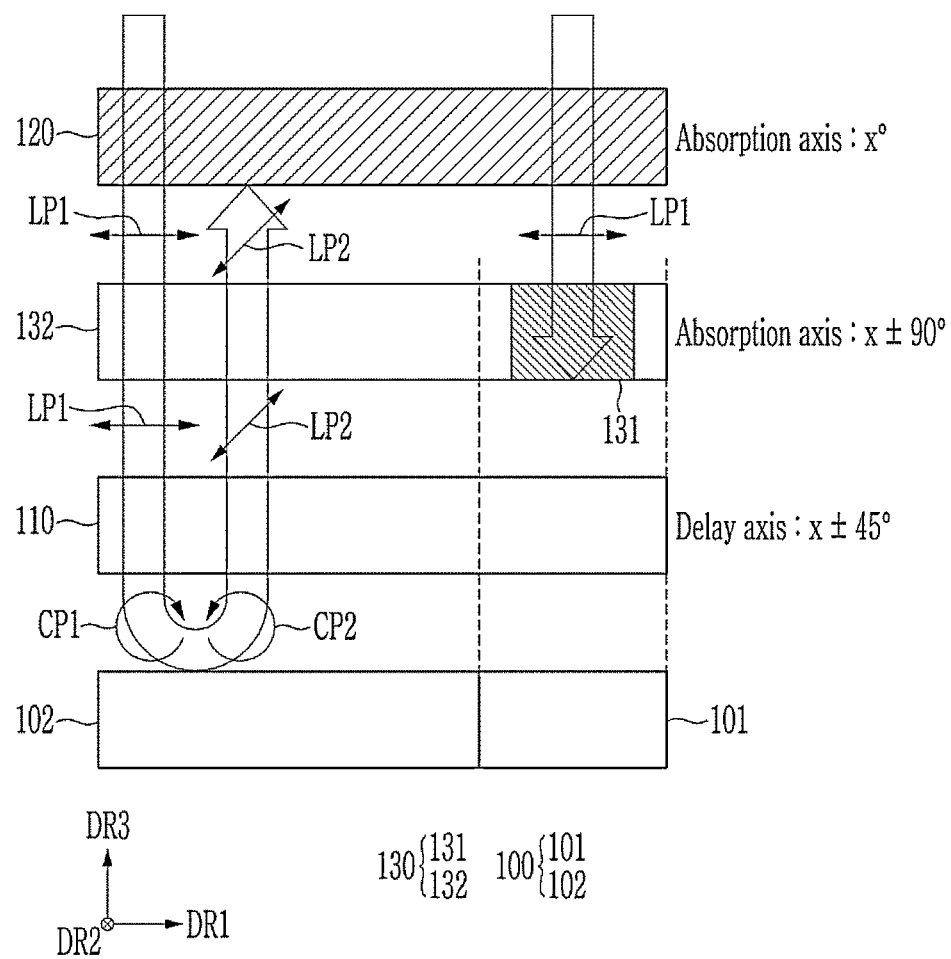
Figure 12:
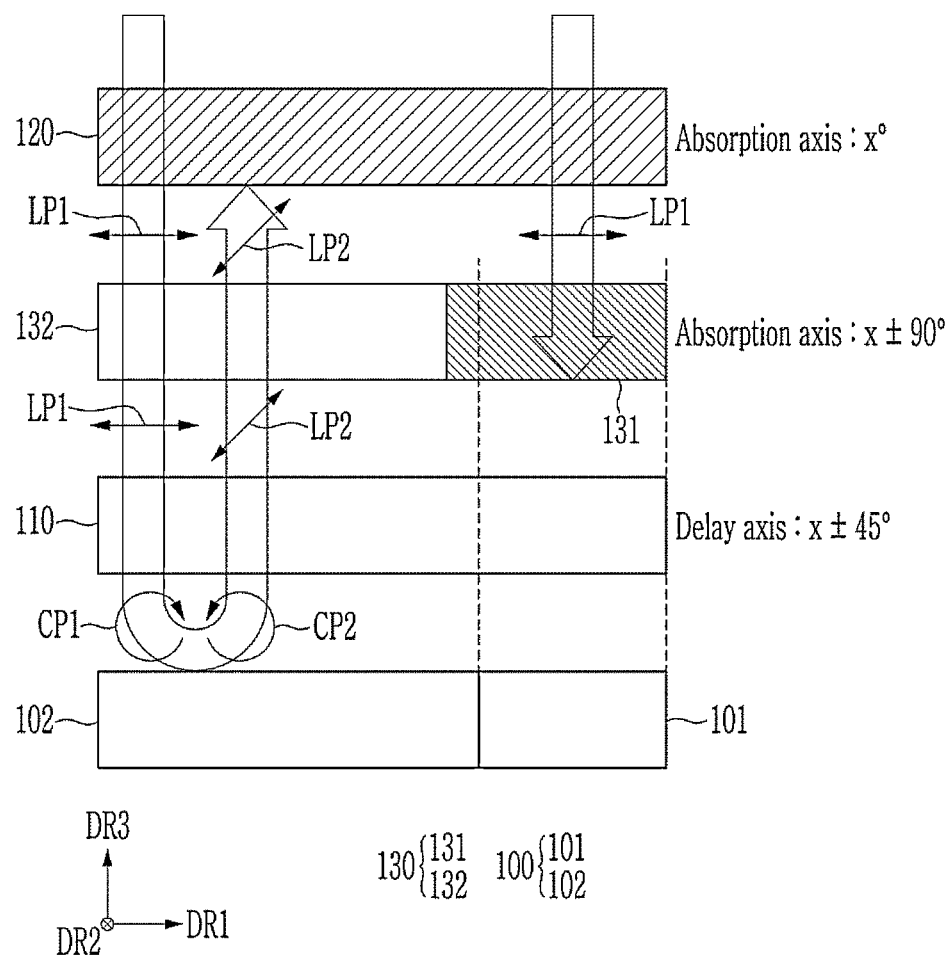

FIGS. 11 and 12 show schematic enlarged cross-sectional views of portions of light emitting display devices according to embodiments.

Referring to FIG. 11, a polarization portion 131 may be formed in a portion of an opening area 101. For example, the polarization portion 131 may be spaced apart from an interface between the opening area 101 and a non-opening area 102. In case that the polarization portion 131 may not overlap the entire of the opening area 101, a portion of an external light may be partially reflected from a display panel 100. The reflected light may exit a polarizer 120, but the amount of the exiting light may be small. Thus, the image display quality may not be deteriorated and may not be recognizable by a user. Therefore, the portion of the opening area 101 may not overlap the polarization portion 131.

Referring to FIG. 12, an opening area 101 may be entirely covered (or overlapped) by a polarization portion 131, and a portion of a non-opening area 102 adjacent to the opening area 101 may also be covered by the polarization portion 131. The polarization portion 131 may overlap the opening area 101 and the portion of the non-opening area 102.

Detailed structures of a polarizer 120 and a phase delay layer 110 is provided below with reference to FIGS. 13 and 14.

Figure 13:
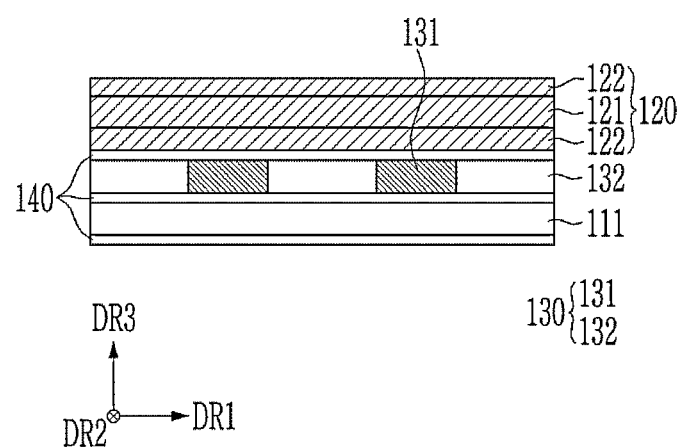
FIGS. 13 and 14 show schematic enlarged cross-sectional views of light emitting display devices according to embodiments.
Figure 14:
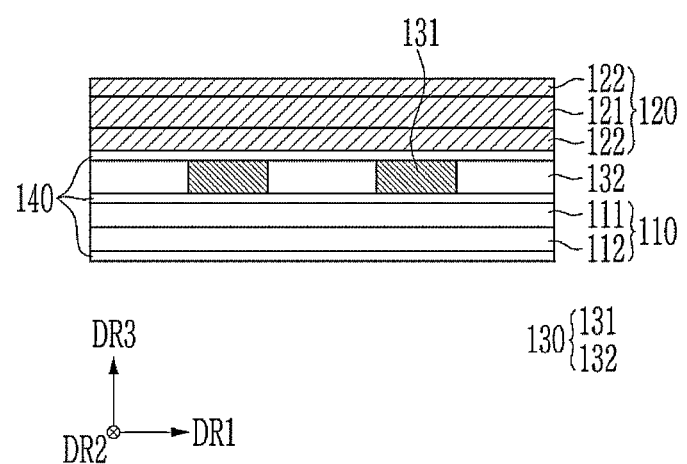

FIGS. 13 and 14 show schematic enlarged cross-sectional views of light emitting display devices according to embodiments.

Referring to FIG. 13, a phase delay layer 110 (e.g., refer to FIG. 2) may include a single layer of a λ/4 plate 111. A polarizer 120 may include a PVA (polyvinyl alcohol) layer 121, and triacetyl cellulose (TAC) layers 122 disposed on upper and lower sides of the PVA layer 121. The PVA layer 121 may include polyvinyl alcohol (PVA)-based molecular chains aligned in a constant direction, and include an iodine-based compound or a dichroic polarization material. The PVA layer 121 may be elongated in a direction and attached to the TAC film 122. Thus, the PVA layer 121 may maintain the elongated characteristic.

Referring to FIG. 13, the polarizer 120, the additional polarizer 130 may be attached to the λ/4 plate 111 by an adhesive 140, and the display panel 100 may be attached to the λ/4 plate 111 by the adhesive 140.

In the embodiment described with reference to FIG. 13, the λ/4 plate 111 may have a delay axis having about 45 degrees with respect to an absorption axis of the polarizer 120 or an absorption axis of the additional polarizer 130.

FIG. 14 shows an embodiment of a display device including a phase delay layer 110 including a λ/2 plate 112 and a λ/4 plate 111. The λ/4 plate 111 may change a linearly polarized light into a circularly polarized light. In another embodiment, the λ/4 plate 111 may be used as a phase delay layer so as to change a linearly polarized light into a circularly polarized light, and the λ/2 plate 112 may be omitted.

Referring to FIG. 14, the phase delay layer 110 may include the λ/4 plate 111 and the λ/2 plate 112. The λ/4 plate 111 may have a delay axis forming an angle of about 70 degrees to about 80 degrees with respect to an absorption axis of a polarizer 120 or an absorption axis of an additional polarizer 130. The λ/2 plate 112 may have a delay axis forming an angle of about 10 degrees to about 20 degrees with respect to the absorption axis of the polarizer 120 or the absorption axis of the additional polarizer 130.

More description of a display panel 100 follows below with reference to FIGS. 15 and 16.

Figure 16:
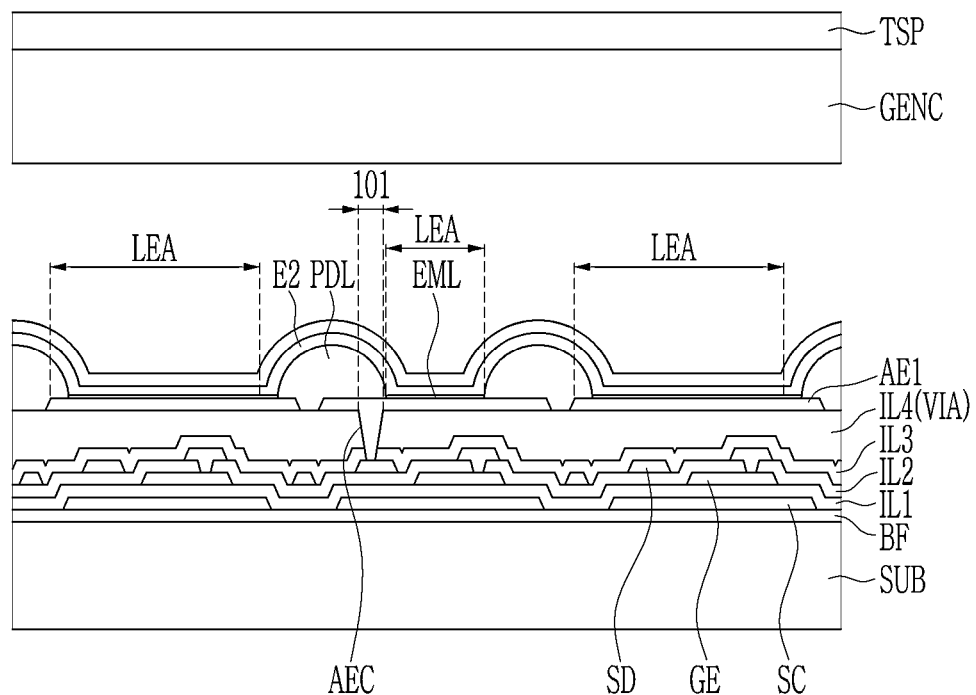

FIGS. 15 and 16 show detailed cross-sectional views of light emitting display panels according to embodiments.

The display panel of FIG. 15 may include a substrate SUB, a buffer layer BF, insulating layers IL1, IL2, IL3, and IL4 (VIA), a semiconductor layer SC, a gate electrode GE, and a source drain electrode SD. The semiconductor layer SC, the gate electrode GE, and the source/drain electrode SD may configure a transistor. A light emitting diode (LED) configured with an anode AE1 (also referred to as a first electrode), an emission layer EML, and a cathode E2 (also referred to as a second electrode) may be formed on the organic film IL4 (VIA). A pixel defining layer PDL may be positioned between adjacent ones of the light emitting diodes (LED). The emission layer EML may include an organic material, an inorganic material, or a combination thereof. The pixel defining layer PDL may include an organic material, and the emission layer EML may overlap an opening area 101. The cathode E2 may be formed on the pixel defining layer PDL. The anode AE1 may further include a connector AEC and may be electrically connected to the transistor to receive an output current. The opening of the IL4 (VIA), in which the connector AEC of the anode AE1 is positioned, may correspond to the opening area 101, and the emission layer EML may be positioned in a light emitting area LEA. Referring also to FIG. 6, a lower layer OL is provided beneath the connector AEC, and extends beneath the opening area 101 and the non-opening areas 102.

An encapsulation layer ENC may be positioned on the pixel defining layer PDL and the light emitting diode (LED). The encapsulation layer ENC may include multiple layers including an inorganic layer and an organic layer. For example, the encapsulation layer ENC may include triple layers formed by sequentially stacking a first inorganic encapsulation layer EIL1, an organic encapsulation layer EOL, and a second inorganic encapsulation layer EIL2. In another embodiment, at least one of the first inorganic encapsulation layer EIL1, the organic encapsulation layer EOL, and the second inorganic encapsulation layer EIL2 may cover (or overlap) a side of the display panel to thus have a structure for preventing moisture or air from being transmitted to the emission layer (EML) from the side.

A touch screen portion (or touch screen part) TSP may be disposed on the encapsulation layer ENC to sense a touch event of a user. The touch screen part TSP may be omitted.

In the embodiment, the encapsulation layer ENC includes the inorganic layer and the organic layer.

FIG. 16 shows a glass encapsulation layer GENC including glass to encapsulate elements disposed thereunder. The glass encapsulation layer GENC of FIG. 16 may also be formed to have a structure formed on the side to prevent moisture or air from being transmitted to the emission layer (EML) from the side.

The light emitting display panel of FIG. 16 may further include a touch screen part TSP on the glass encapsulation layer GENC to sense a touch of a user. The touch screen part TSP may be omitted depending on embodiments.

The structure of the thin film transistor has been described with reference to FIGS. 15 and 16, and explanations of a circuit structure and a cross-sectional structure of a pixel is provided below with reference to FIGS. 17 to 20.

Figure 17:
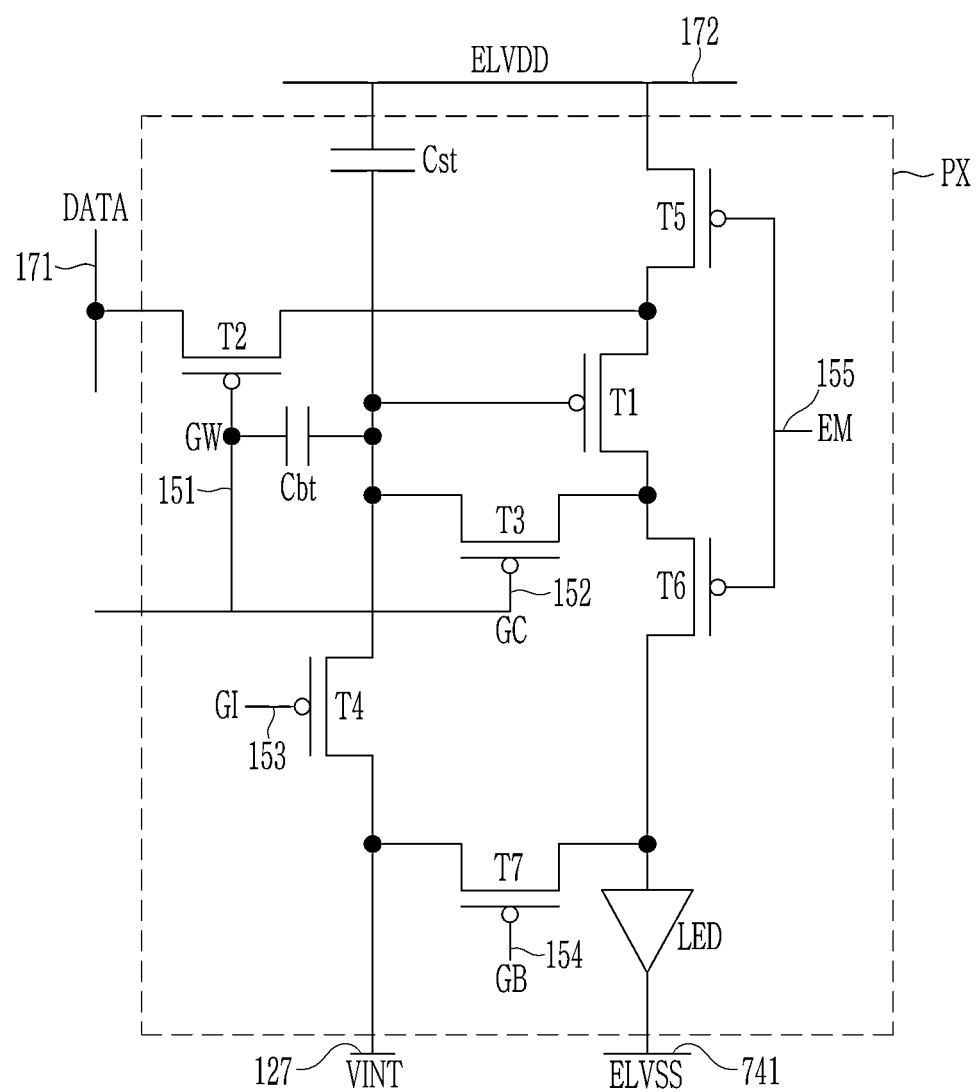
FIG. 17 shows an equivalent circuit diagram of a pixel according to an embodiment.
Figure 18:
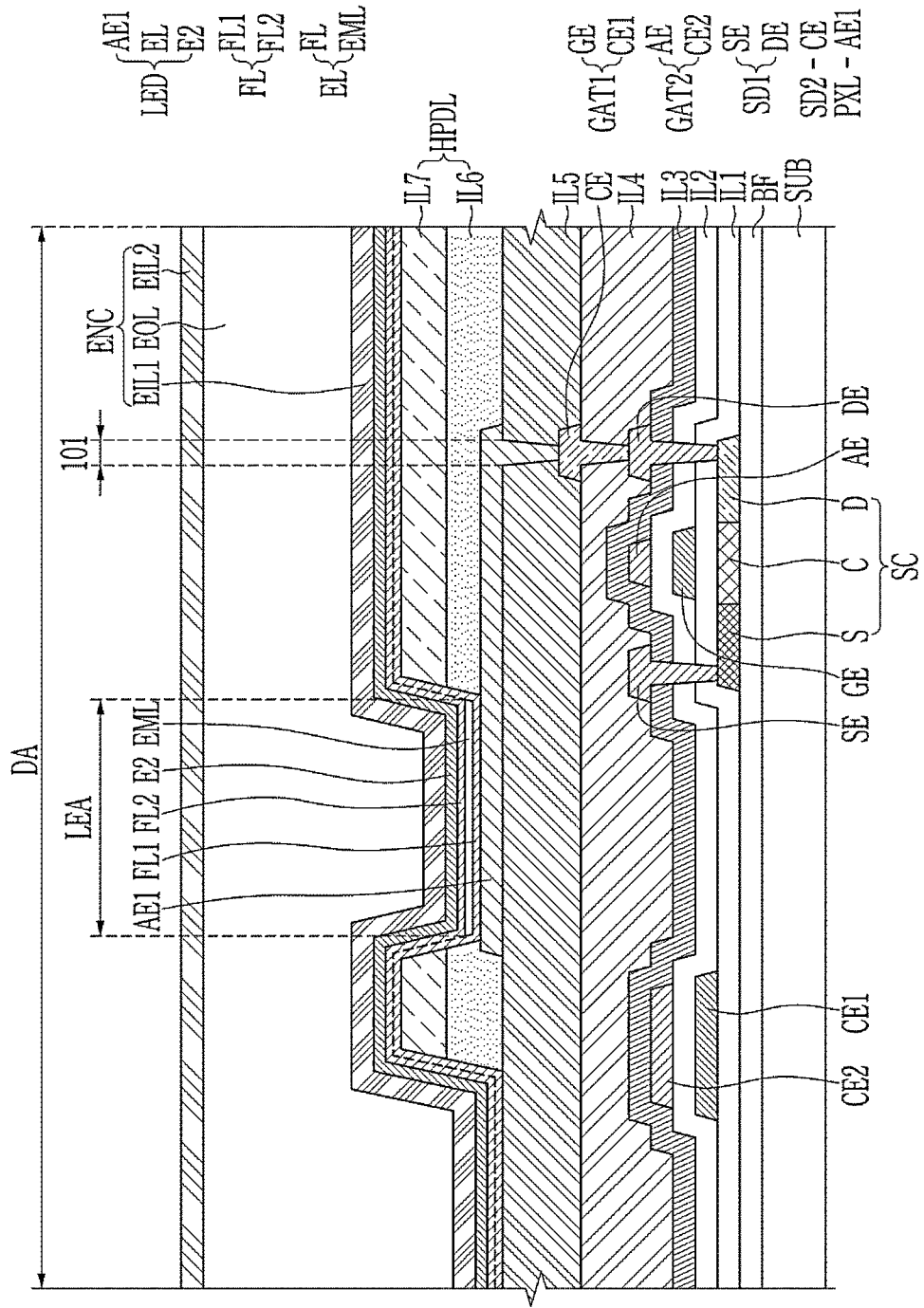
FIG. 18 shows a cross-sectional view of a display panel including the pixel described with reference to FIG. 17.

A structure of a pixel according to an embodiment will now be described with reference to FIGS. 17 and 18. FIGS. 17 and 18 show a thin film transistor made of a polycrystalline semiconductor.

FIG. 17 shows an equivalent circuit diagram of a pixel according to an embodiment, and FIG. 18 shows a schematic cross-sectional view of a display panel including a pixel described with reference to FIG. 17.

Referring to FIG. 17, each pixel PX may include a pixel circuit unit (or pixel circuit part) and a light emitting diode LED. The pixel circuit part may include transistors and a capacitor. The light emitting diode LED may receive a current from the pixel circuit part and may emit light.

The pixel PX of the display device may include transistors T1, T2, T3, T4, T5, T6, and T7 electrically connected to wires 127, 151, 152, 153, 154, 155, 171, 172, and 741, a storage capacitor Cst, a boost capacitor Cbt, and a light emitting diode LED.

The wires 127, 151, 152, 153, 154, 155, 171, 172, and 741 may be electrically connected to the pixel PX. The wires 127, 151, 152, 153, 154, 155, 171, 172, and 741 may include a first initialization voltage line 127, a first scan signal line 151, a second scan signal line 152, an initialization control line 153, a bypass control line 154, an emission control line 155, a data line 171, a driving voltage line 172, and a common voltage line 741.

The first scan signal line 151 may be electrically connected to a scan driver (not illustrated) and transmit a first scan signal GW to a second transistor T2. The second scan signal line 152 may be a same wire as the first scan signal line 151, and transmit a second scan signal GC that is the same scan signal as the first scan signal GW to a third transistor T3.

The initialization control line 153 may transmit an initialization control signal GI to a fourth transistor T4. The bypass control line 154 may transmit a bypass signal GB to a seventh transistor T7. The bypass control line 154 may be made of a first scan signal line 151 on the previous stage. The emission control line 155 may transmit an emission control signal EM to a fifth transistor T5 and a sixth transistor T6.

The data line 171 may transmit a data voltage DATA generated from a data driver 59 to the second transistor T2, and the luminance of light emitted from the light emitting diode LED may be changed according to the data voltage DATA applied to the pixel PX.

The driving voltage line 172 may apply a driving voltage ELVDD to the storage capacitor Cst and the fifth transistor T5. The first initialization voltage line 127 may transmit a first initialization voltage VINT to the fourth transistor T4 and the seventh transistor T7. The common voltage line 741 may apply a common voltage ELVSS to a cathode of the light emitting diode LED. Each of the voltages applied to the driving voltage line 172, the first initialization voltage line 127, and the common voltage line 741 may be constant.

The transistors T1, T2, T3, T4, T5, T6, and T7 of the pixel circuit part may include a driving transistor T1, a second transistor T2, a third transistor T3, a fourth transistor T4, a fifth transistor T5, a sixth transistor T6, and a seventh transistor T7. The transistors T1, T2, T3, T4, T5, T6, and T7 may include a polycrystalline silicon semiconductor.

The second transistor T2 may transmit the data voltage DATA into the pixel PX. The fourth transistor T4 may initialize a voltage at a gate of the driving transistor T1 to be the first initialization voltage VINT. The seventh transistor T7 may initialize a voltage at an anode of the light emitting diode LED to be the first initialization voltage VINT.

The fifth transistor T5 may transmit a driving voltage ELVDD to the driving transistor T1. The sixth transistor T6 may transmit an output current of the driving transistor T1 to the light emitting diode LED. A period, in which the fifth transistor T5 and the sixth transistor T6 are turned on, may be referred to as a light emitting period.

The third transistor T3 may electrically connect the gate of the driving transistor T1 to an output-side electrode of the driving transistor T1, and the data voltage DATA may pass through the driving transistor T1 and may be stored in the storage capacitor Cst, which is electrically connected to the gate of the driving transistor T1. The voltage finally stored in the storage capacitor Cst may have a voltage value generated by compensating a threshold voltage of the driving transistor T1.

The driving transistor T1 may generate an output current and output the output current based on the voltage stored in the storage capacitor Cst.

In case that the first scan signal GW applied to the first scan signal line 151 is changed to a low voltage and turns on the second transistor T2, the boost capacitor Cbt may reduce the voltage at the gate of the driving transistor T1. Thus, the driving transistor T1 may maintain a turn-on state.

In the embodiment, the pixel PX may include seven transistors T1, T2, T3, T4, T5, T6, and T7, one storage capacitor Cst, and one boost capacitor Cbt. However, the structure of the pixel PX is not limited thereto, and the number of transistors, the number of capacitors, and connection relationships thereof may be changed in various ways. For example, each of the third transistor T3, the fourth transistor T4, and/or the seventh transistor T7 may include an oxide semiconductor (e.g. N-MOS transistor), and may be turned on in case that a high-level voltage is transmitted to the gate electrode.

A cross-sectional structure of the display panel is provided below with reference to FIG. 18. FIG. 18 shows a schematic cross-sectional view of a display panel including the pixel of FIG. 17.

Referring to FIG. 18, a substrate SUB may include an inorganic insulating material such as glass or an organic insulating material such as plastic including a polyimide (PI). The substrate SUB may be a single layer or a multi-layer. The substrate SUB may have a structure in which at least one base layer including a polymer resin and at least one inorganic layer are alternately stacked.

The substrate SUB may have various degrees of flexibility. The substrate SUB may be a rigid substrate or a flexible substrate that may be bent, folded, or rolled.

A buffer layer BF may be positioned on the substrate SUB. The buffer layer BF may prevent the transmission of impurities from the substrate SUB to an upper portion of the buffer layer BF, and prevent deterioration of a semiconductor layer SC and may ease stresses. For example, the buffer layer BF may protect the semiconductor layer SC from the impurities. The buffer layer BF may include an inorganic insulating material or an organic insulating material such as a silicon nitride or a silicon oxide. All or part of the buffer layer BF may be omitted. In another embodiment, a metal layer (not shown) may be formed between the substrate SUB and the buffer layer BF. The metal layer may protect the semiconductor layer SC to maintain the characteristic of the semiconductor layer SC.

The semiconductor layer SC may be positioned on the buffer layer BF. The semiconductor layer SC may include polysilicon. The semiconductor layer SC may include a channel region C, a first region S, and a second region D. The first region S and the second region D may be disposed on sides (or both side portions) of the channel region C. The channel region C may be implemented with, for example, a semiconductor region without impurities or doped with a smaller amount of impurities than those of the first region S and the second region D, and the first region S and the second region D may be implemented with, for example, semiconductor regions doped with a greater amount of impurities than the channel region C.

A first inorganic insulating layer IL1 may be positioned on the semiconductor layer SC. The first inorganic insulating layer IL1 may have a single-layered or multi-layered structure including at least one of a silicon oxide ($SiO_x$), a silicon nitride ($SiN_x$), and a silicon oxynitride ($SiO_xN_y$).

A first gate conductive layer GAT1 including a gate electrode GE and a first capacitor electrode CE1 may be positioned on the first inorganic insulating layer IL1, The first gate conductive layer GAT1 may be (or include) a single layer or multi-layer on which a metal film including at least one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region C of the semiconductor layer SC in a plan view.

A second inorganic insulating layer IL2 may be positioned on the first gate conductive layer GAT1 and the first inorganic insulating layer IL1. The second inorganic insulating layer IL2 may be a single layer or multi-layer including at least one of a silicon oxide ($SiO_x$), a silicon nitride ($SiN_x$), and a silicon oxynitride ($SiO_xN_y$).

A second gate conductive layer GAT2 including an upper electrode AE and a second capacitor electrode CE2 may be positioned on the second inorganic insulating layer IL2. The second capacitor electrode CE2 and the upper electrode AE may be different portions of a conductive pattern. The second capacitor electrode CE2 may be electrically connected to the upper electrode AE. The second gate conductive layer GAT2 may be a single layer or multi-layer on which a metal film including at least one of copper (Cu), a copper alloy, aluminum (Al), an aluminum alloy, molybdenum (Mo), a molybdenum alloy, titanium (Ti), and a titanium alloy is stacked.

The first capacitor electrode CE1 may overlap the second capacitor electrode CE2 to configure the storage capacitor Cst.

A third inorganic insulating layer IL3 may be positioned on the second gate conductive layer GAT2 and the second inorganic insulating layer IL2. The third inorganic insulating layer IL3 may be a single layer or multi-layer including at least one of the silicon oxide ($SiO_x$), the silicon nitride ($SiN_x$), and the silicon oxynitride ($SiO_xN_y$).

A first data conductive layer SD1 including a source electrode SE and a drain electrode DE may be positioned on the third inorganic insulating layer IL3. The source electrode SE and the drain electrode DE may be respectively electrically connected to the first region S and the second region D of the semiconductor layer SC through contact holes formed through the first to third inorganic insulating layers IL1, IL2, and IL3. In another embodiment, the semiconductor layer SC may extend (e.g. directly extend) without the source electrode SE or the drain electrode DE to be electrically connected to an adjacent pixel. The first data conductive layer SD1 may include at least one of aluminum (Al), silver (Ag), magnesium (Mg), gold (Au), nickel (Ni), chromium (Cr), nickel (Ni), calcium (Ca), molybdenum (Mo), titanium (Ti), tungsten (W), copper (Cu), and an alloy thereof, and may have a single-layered or multi-layered structure. The first data conductive layer SD1 according to the embodiment may have a triple-layered structure in which an aluminum (Al) layer is disposed between two titanium (Ti) layers. Additional descriptions of the triple-layered structure of Ti/Al/Ti are provided below.

The first organic insulating layer IL4 and the second organic insulating layer IL5 may be sequentially positioned on the third inorganic insulating layer IL3 and the first data conductive layer SD1. Each of the first organic insulating layer IL4 and the second organic insulating layer IL5 may include an organic insulating material such as a general purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

A connecting member CE may be positioned between the first organic insulating layer IL4 and the second organic insulating layer IL5. The connecting member CE configures a second data conductive layer SD2, and may electrically connect the drain electrode DE to the first electrode AE1. The second data conductive layer SD2 may include at least one of aluminum (Al), silver (Ag), magnesium (Mg), gold (Au), nickel (Ni), chromium (Cr), nickel (Ni), calcium (Ca), molybdenum (Mo), titanium (Ti), tungsten (W), copper (Cu), and an alloy thereof, and may have a single-layered or multi-layered structure made of the above-mentioned materials.

The second data conductive layer SD2 according to the embodiment may have a triple-layered structure in which an aluminum (Al) layer is disposed between two titanium (Ti) layers. The second data conductive layer SD2 may have the same triple-layered structure as the first data conductive layer SD1. Additional descriptions of the triple-layered structure of Ti/Al/Ti are provided below.

A first electrode AE1 (also referred to as a pixel electrode or anode) may be positioned on the second organic insulating layer IL5. The first electrode AE1 may be implemented with, for example, a pixel electrode layer PXL, and may be electrically connected to the connecting member CE through an opening of the second organic insulating layer IL5. The first electrode AE1 (anode) may be electrically connected to the connecting member CE through the opening of the second organic insulating layer IL5. The opening of the second organic insulating layer IL5 may correspond to the opening area 101 in a plan view, and the second organic insulating layer IL5 may correspond to the organic film, which defines the opening area 101. The first electrode AE1 may be electrically connected to the drain electrode DE. The first electrode AE1 may include a metal at least one of silver (Ag), lithium (Li), calcium (Ca), aluminum (Al), magnesium (Mg), gold (Au), and an alloy thereof, and may include a transparent conductive oxide (TCO) such as an indium tin oxide (ITO) or an indium zinc oxide (IZO). The first electrode AE1 may be made of a single layer including a metallic material or a transparent conductive oxide, or multi-layer made of the above-mentioned materials. In the embodiment, the first electrode AE1 may have a triple-layered structure of indium tin oxide (ITO)/silver (Ag)/indium tin oxide (ITO). Additional descriptions of the structure of ITO/Ag/ITO are provided below.

The gate electrode GE and the semiconductor layer SC may configure a transistor. For example, transistors may include a source electrode SE and a drain electrode DE electrically connected to the first region S and the second region D of the semiconductor layer SC, respectively. For example, the transistor may be configured with the gate electrode GE and the semiconductor layer SC without using the source electrode SE or the drain electrode DE. The transistor (e.g. the sixth transistor T6 shown in FIG. 17) may be electrically connected to the first electrode AE1 to supply a current to the light emitting diode LED.

A pixel defining layer IL6 and a spacer IL7 may be positioned on the second organic insulating layer IL5 and the first electrode AE1.

The pixel defining layer IL6 may have an opening overlapping at least part of the first electrode AE1. The opening of the pixel defining layer IL6 may define the light emitting area LEA. The opening of the pixel defining layer IL6 may have a planar shape similar to the first electrode AE1. The opening of the pixel defining layer IL6 may have a rhombic shape or an octagonal shape that is deformed to be similar to the rhombus shape in the plan view. The shapes of the opening is not limited thereto, and the opening of the pixel defining layer IL6 may have various shapes such as a quadrangle, a polygon, a circle, an oval, or other suitable shapes.

Each of the pixel defining layer IL6 and the spacer IL7 may include an organic insulating material such as a general purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer An intermediate layer EL may be positioned on the pixel defining layer IL6, the spacer IL7, and the first electrode AE1. The intermediate layer EL may include an emission layer EML and a function layer FL. The emission layer EML of the intermediate layer EL may generate a color light. The emission layer EML may include an organic material and/or an inorganic material. The emission layer EML may be formed in the opening of the pixel defining layer IL6.

The function layer FL of the intermediate layer EL may include at least one of a hole injection layer (HIL), a hole transporting layer (HTL), an electron transporting layer (ETL), and an electron injection layer (EIL). The function layer FL may be divided into a first function layer FL1 and a second function layer FL2. The first function layer FL1 may be positioned between the first electrode AE1 and the emission layer EML. The second function layer FL2 may be positioned between the emission layer EML and the second electrode E2. The respective function layers FL may overlap the entire substrate SUB. The function layer FL may be disposed on pixels.

A second electrode E2 may be positioned on the intermediate layer EL. The second electrode E2 may include a reflective metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or calcium (Ca), or may include a transparent conductive oxide (TCO) such as an indium tin oxide (ITO) or an indium zinc oxide (IZO).

The first electrode AE1, the intermediate layer EL, and the second electrode E2 may configure a light emitting diode LED. The first electrode AE1 may be (or include) an anode that is a hole injection electrode, and the second electrode E2 may be a cathode that is an electron injection electrode. However, the embodiment is not limited thereto. For example, the first electrode AE1 may be a cathode, and the second electrode E2 may be an anode based on methods for driving a light emitting display device.

Electrons injected into the intermediate layer EL from the first electrode AE1 and holes injected into the intermediate layer EL from the second electrode E2 may be combined to generate excitons in the emission layer EML. In case that the excitons fall to the ground state from the excited state, the emission layer EML may emit light.

An encapsulation layer ENC may be positioned on the second electrode E2. The encapsulation layer ENC may overlap an upper side and a lateral side of the light emitting diode LED, and may seal the light emitting diode LED. The light-emitting device (e.g. light emitting diode LED) may be vulnerable to moisture or oxygen, and the encapsulation layer ENC may seal the light emitting diode LED to prevent an inflow of external moisture or oxygen.

The encapsulation layer ENC may include multiple layers. The encapsulation layer ENC may be formed of a complex film including an inorganic layer and an organic layer. For example, the encapsulation layer ENC may be made of triple layers including a first inorganic encapsulation layer EIL1, an organic encapsulation layer EOL, and a second inorganic encapsulation layer EIL2, which may be sequentially stacked.

The first inorganic encapsulation layer EIL1 may overlap the second electrode E2. The first inorganic encapsulation layer EIL1 may prevent external moisture or oxygen from permeating into the light emitting diode LED. For example, the first inorganic encapsulation layer EIL1 may include a silicon nitride, a silicon oxide, a compound thereof, or a combination thereof. The first inorganic encapsulation layer EIL1 may be formed through a deposition process.

The organic encapsulation layer EOL may be disposed on the first inorganic encapsulation layer EIL1 and may contact (e.g. directly contact) the first inorganic encapsulation layer EIL1. An uneven portion formed on an upper side of the first inorganic encapsulation layer EIL1 or particles provided on the first inorganic encapsulation layer EIL1 may be covered by the organic encapsulation layer EOL, and an upper side of the organic encapsulation layer EOL may be flat (or planarized) while the upper side of the first inorganic encapsulation layer EIL1 includes the uneven portion of the particles. The organic encapsulation layer EOL may also release stresses between adjacent layers, which contact the organic encapsulation layer EOL. For example, the organic encapsulation layer EOL may release stresses between the first inorganic encapsulation layer EIL1 or the second inorganic encapsulation layer EIL2. The organic encapsulation layer EOL may include an organic material, and may be formed by a solution process such as a spin coating, a slit coating, an inkjet process, or other suitable processes.

The second inorganic encapsulation layer EIL2 may be disposed on the organic encapsulation layer EOL to cover (or overlap) the organic encapsulation layer EOL. Since the organic encapsulation layer EOL has the flat upper side, the second inorganic encapsulation layer EIL2 may be further stably formed on a relatively planar side than is disposed on the first inorganic encapsulation layer EIL1. The second inorganic encapsulation layer EIL2 may encapsulate the moisture discharged from the organic encapsulation layer EOL, to prevent the moisture from being provided to the outside or thereinto. The second inorganic encapsulation layer EIL2 may include a silicon nitride, a silicon oxide, or a compound of a combination thereof. The second inorganic encapsulation layer EIL2 may be made by a deposition process.

Although not shown in the drawings, a capping layer may be positioned between the second electrode E2 and the encapsulation layer ENC. The capping layer may include an organic material. The capping layer may protect the second electrode E2 from a subsequent process, for example, a sputtering process, and may improve light emitting efficiency of the light emitting diode LED. The capping layer may have a refractive index greater than that of the first inorganic encapsulation layer EIL1.

While FIG. 18 illustrates a transistor, the actual pixel may include multiple transistors as shown in FIG. 17.

An embodiment in which a thin film transistor includes a polycrystalline semiconductor and an oxide semiconductor will now be described with reference to FIGS. 19 and 20.

Figure 19:
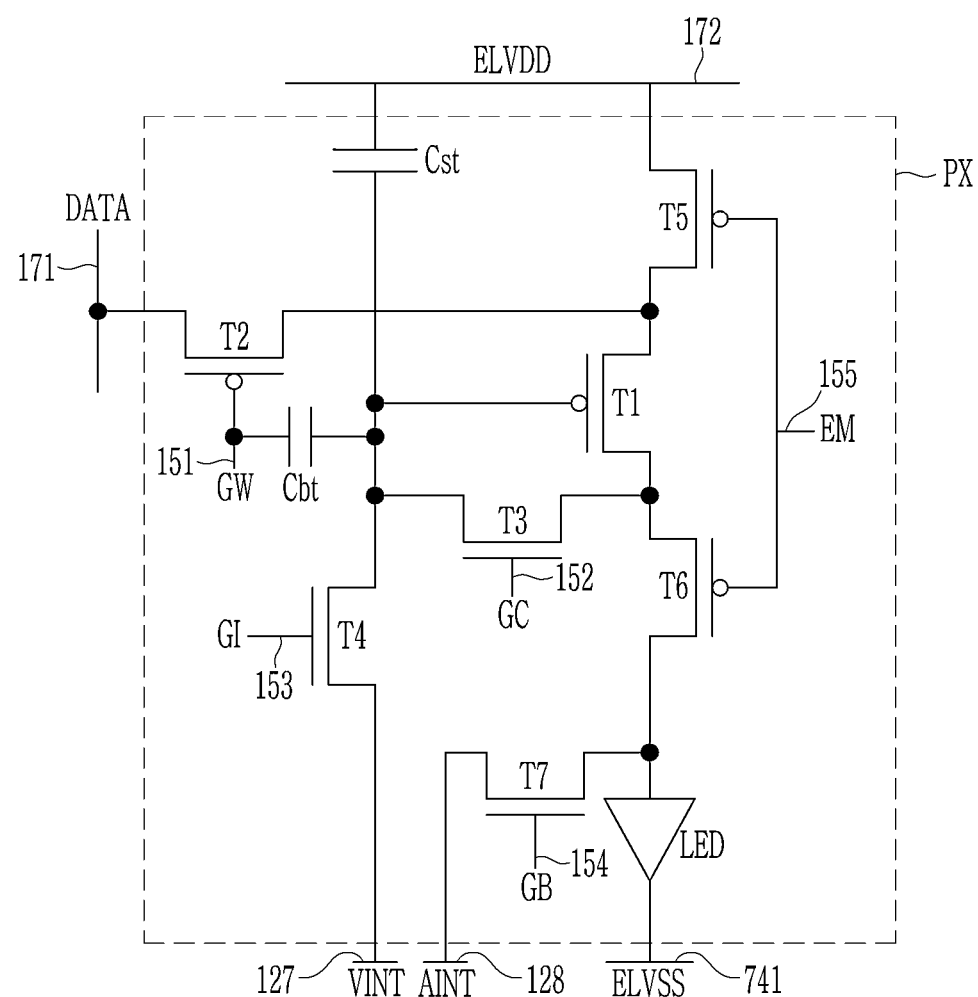
FIG. 19 shows an equivalent circuit diagram of a pixel according to an embodiment.
Figure 20:
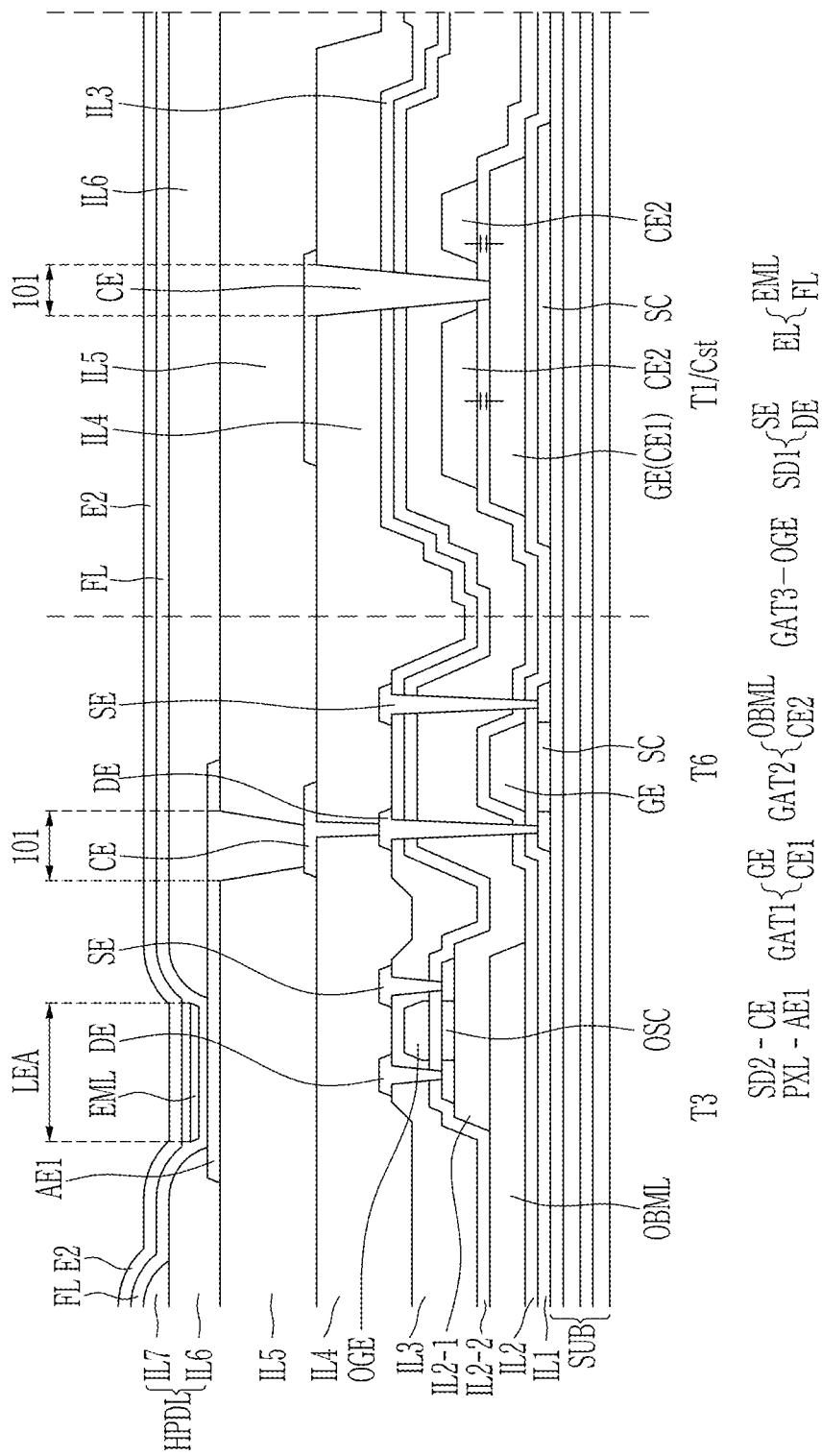
FIG. 20 shows a schematic cross-sectional view of a display panel including the pixel according to an embodiment described with reference to FIG. 19.

FIG. 19 shows an equivalent circuit diagram of a pixel according to an embodiment, and FIG. 20 shows a schematic cross-sectional view of a display panel including a pixel according to an embodiment described with reference to FIG. 19.

Referring to FIGS. 19 and 20, the pixel PX according to the embodiment is different from the embodiment of FIGS. 17 and 18 at least in that a third transistor T3, a fourth transistor T4, and a seventh transistor T7 of the pixel PX of FIG. 19 include oxide semiconductors. Thus, a second transistor T2 and the third transistor T3 may receive different scan signals GW and GC from those of FIGS. 17 and 18. In an embodiment described with reference to FIG. 19, the fourth transistor T4 and the seventh transistor T7 may receive different initialization voltages VINT and AINT from those of FIGS. 17 and 18. Thus, any repetitive explanation for the same elements will be omitted.

Referring to FIG. 19, each pixel PX of the display device may include transistors T1, T2, T3, T4, T5, T6, and T7, a storage capacitor Cst, a boost capacitor Cbt, and a light emitting diode LED, which may be electrically connected to the wires 127, 128, 151, 152, 153, 154, 155, 171, 172, and 741.

The wires 127, 128, 151, 152, 153, 154, 155, 171, 172, and 741 may be electrically connected to the pixel PX. The wires 127, 128, 151, 152, 153, 154, 155, 171, 172, and 741 may include a first initialization voltage line 127, a second initialization voltage line 128, a first scan signal line 151, a second scan signal line 152, an initialization control line 153, a bypass control line 154, an emission control line 155, a data line 171, a driving voltage line 172, and a common voltage line 741.

The first scan signal line 151 may be electrically connected to the scan driver and transmit a first scan signal GW to the second transistor T2. The second scan signal line 152 may apply a voltage of an opposite polarity to the voltage applied to the first scan signal line 151 at the same timing as the signal of the first scan signal line 151. For example, in case that a voltage of negative polarity is applied to the first scan signal line 151, a voltage of positive polarity may be applied to the second scan signal line 152. The second scan signal line 152 may transmit a second scan signal GC to the third transistor T3.

The initialization control line 153 may transmit an initialization control signal GI to the fourth transistor T4. The bypass control line 154 may transmit a bypass signal GB to the seventh transistor T7. The bypass control line 154 may be made of a first scan signal line 151 on the previous stage. The emission control line 155 may transmit an emission control signal EM to a fifth transistor T5 and a sixth transistor T6.

The data line 171 may transmit a data voltage DATA generated by a data driver (not shown) to the second transistor T2, and a luminance of light emitted from the light emitting diode LED may be changed according to the data voltage DATA applied to the pixel PX.

The driving voltage line 172 may apply a driving voltage ELVDD to the storage capacitor Cst and the fifth transistor T5. The first initialization voltage line 127 may transmit a first initialization voltage VINT to the fourth transistor T4, and the second initialization voltage line 128 may transmit a second initialization voltage AINT to the seventh transistor T7. The common voltage line 741 may apply a common voltage ELVSS to a cathode of the light emitting diode LED. In the embodiment, each of the voltages applied to the driving voltage line 172, the first and second initialization voltage lines 127 and 128, and the common voltage line 741 may be constant.

The transistors T1, T2, T3, T4, T5, T6, and T7 may include a driving transistor T1, a second transistor T2, a third transistor T3, the fourth transistor T4, a fifth transistor T5, a sixth transistor T6, and a seventh transistor T7. The transistors T1, T2, T3, T4, T5, T6, and T7 may include an oxide transistor including an oxide semiconductor and a silicon transistor including a polycrystalline silicon semiconductor. In the embodiment described with reference to FIG. 19, the third transistor T3, the fourth transistor T4, and the seventh transistor T7 may be made of the oxide transistors, and the driving transistor T1, the second transistor T2, the fifth transistor T5, and the sixth transistor T6 may be made of the silicon transistors. However, the transistors T1, T2, T3, T4, T5, T6, and T7 are not limited thereto, and may be made of various silicon transistors and/or oxide transistors.

The second transistor T2 may transmit the data voltage DATA to the pixel PX. The fourth transistor T4 may initialize a voltage at a gate of the driving transistor T1 to be the first initialization voltage AINT. The seventh transistor T7 may initialize a voltage at an anode of the light emitting diode LED to be the second initialization voltage AINT.

The fifth transistor T5 may transmit a driving voltage ELVDD to the driving transistor T1. The sixth transistor T6 may transmit an output current of the driving transistor T1 to the light emitting diode LED. A period, in which the fifth transistor T5 and the sixth transistor T6 are turned on, may be referred as a light emitting period.

The third transistor T3 may electrically connect the gate of the driving transistor T1 to an output-side electrode, and the data voltage DATA may pass through the driving transistor T1 and may be stored in the storage capacitor Cst, which is electrically connected to the gate of the driving transistor T1. The voltage finally stored in the storage capacitor Cst may be a voltage value generated by compensating a threshold voltage of the driving transistor T1.

The driving transistor T1 may generate an output current and output the output current based on the voltage stored in the storage capacitor Cst.

In case that the first scan signal GW applied to the first scan signal line 151 is changed to a low voltage and turns on the second transistor T2, the boost capacitor Cbt may reduce the voltage at the gate of the driving transistor T1. Thus, the driving transistor T1 may maintain a turn-on state.

In the embodiment, the pixel PX may include seven transistors T1, T2, T3, T4, T5, T6, and T7, one storage capacitor Cst, and one boost capacitor Cbt. However, the structure of the pixel PX is not limited thereto, and the number of transistors, the number of capacitors, and connection relationships thereof may be changeable in various ways.

A cross-sectional structure of the pixel PX in the display area (DA, see also FIG. 18) having the structure described with reference to FIG. 19 is provided below with reference to FIG. 20. FIG. 20 shows a schematic cross-sectional view of a display panel including the pixel PX of FIG. 19.

Referring to FIG. 19, a substrate SUB may have various degrees of flexibility. The substrate SUB may be made of insulating layers and may be a flexible substrate that may be bent, folded, or rolled.

A buffer layer BF (refer to FIG. 18) may be positioned on the substrate SUB. In the embodiment, the buffer layer BF (refer to FIG. 18) may be omitted as shown in FIG. 20.

A semiconductor layer SC may be positioned on the substrate SUB. The semiconductor layer SC may include polysilicon. The semiconductor layer SC may include a channel region overlapping a gate electrode GE, a first region and a second region positioned on sides thereof. The gate electrode GE may be positioned on the semiconductor layer SC, and a first inorganic insulating layer IL1 may be interposed between the gate electrode GE and the semiconductor layer SC. The channel region may be implemented with, for example, a semiconductor region without impurities or doped with a smaller amount of impurities than those of the first region and the second region, and the first region and the second region may be implemented with, for example, semiconductor regions doped with greater amount of impurities than the channel region.

A first inorganic insulating layer IL1 may be positioned on the semiconductor layer SC. The first inorganic insulating layer IL1 may have a single-layered or multi-layered structure including at least one of a silicon oxide ($SiO_x$), a silicon nitride ($SiN_x$), and a silicon oxynitride ($SiO_xN_y$).

A first gate conductive layer GAT1 including a gate electrode GE and a first capacitor electrode CE1 may be positioned on the first inorganic insulating layer IL1, The first gate conductive layer GAT1 may be a single layer or multi-layer on which a metal film including at least one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region of the semiconductor layer SC in a plan view.

A second inorganic insulating layer IL2 may be positioned on the first gate conductive layer GAT1 and the first inorganic insulating layer IL1. The second inorganic insulating layer IL2 may be a single layer or multi-layer including at least one of a silicon oxide ($SiO_x$), a silicon nitride ($SiN_x$), and a silicon oxynitride ($SiO_xN_y$).

A second gate conductive layer GAT2 including a second capacitor electrode CE2 and an overlapping electrode OBML may be positioned on the second inorganic insulating layer IL2. The second capacitor electrode CE2 and the overlapping electrode OBML may be different portions of one conductive pattern. The second capacitor electrode CE2 may overlap the first capacitor electrode CE1 to form a storage capacitor Cst. The overlapping electrode OBML may overlap a channel of an oxide semiconductor layer OSC. An oxide semiconductor as shown in FIG. 20 includes the oxide semiconductor layer OSC. Additional descriptions of the oxide semiconductor layer OSC follow below. The second gate conductive layer GAT2 may be (or include) a single layer or multi-layer including a metal film including at least one of copper (Cu), a copper alloy, aluminum (Al), an aluminum alloy, molybdenum (Mo), a molybdenum alloy, titanium (Ti), and a titanium alloy, which may be stacked.

A second-1 inorganic insulating layer IL2-1 may be positioned on the second gate conductive layer GAT2 and the second inorganic insulating layer IL2. The second-1 inorganic insulating layer IL2-1 may be a single layer or multi-layer including at least one of the silicon oxide ($SiO_x$), the silicon nitride ($SiN_x$), and the silicon oxynitride ($SiO_xN_y$).

An oxide semiconductor layer OSC may be positioned on the second-1 inorganic insulating layer IL2-1. The oxide semiconductor layer OSC may include a channel region, a first region, and a second region. The channel region of the oxide semiconductor layer OSC may overlap a gate electrode (e.g. a gate electrode OGE of the third transistor T3). The first region and the second region of the oxide semiconductor layer OSC may be positioned on respective sides thereof. The channel region may be implemented with, for example, a semiconductor region without impurities or doped with a smaller amount of impurities than those of the first region and the second region. The first region and the second region may be implemented with, for example, semiconductor regions in which a greater amount of impurities are doped than those of the channel region.

A second-2 inorganic insulating layer IL2-2 may be positioned on the second-1 inorganic insulating layer IL2-1 and the oxide semiconductor layer OSC. The second-2 inorganic insulating layer IL2-2 may be a single layer or multi-layer including at least one of the silicon oxide ($SiO_x$), the silicon nitride ($SiN_x$), and the silicon oxynitride ($SiO_xN_y$).

A third gate conductive layer GAT3 including an oxide gate electrode OGE may be positioned on the second-2 inorganic insulating layer IL2-2. For example, the third gate conductive layer GAT3 may further include an oxide consuming electrode. The oxide gate electrode OGE may overlap the channel of the oxide semiconductor layer OSC in a plan view.

The third gate conductive layer GAT3 may be a single layer or multi-layer on which a metal film including at least one of copper (Cu), a copper alloy, aluminum (Al), an aluminum alloy, molybdenum (Mo), a molybdenum alloy, titanium (Ti), and a titanium alloy is stacked.

A third inorganic insulating layer IL3 may be positioned on the second-2 inorganic insulating layer IL2-2 and third gate conductive layer GAT3. The third inorganic insulating layer IL3 may be a single layer or multi-layer including at least one of the silicon oxide ($SiO_x$), the silicon nitride ($SiN_x$), and the silicon oxynitride ($SiO_xN_y$).

A first data conductive layer SD1 including a source electrode SE and a drain electrode DE may be positioned on the third inorganic insulating layer IL3. For example, the first data conductive layer SD1 may include multiple source electrodes SE and multiple drain electrodes DE. The source electrode SE and the drain electrode DE may be respectively electrically connected to the first region and the second region of the semiconductor layer SC through contact holes formed through the first to third inorganic insulating layers IL1, IL2, IL2-1. IL2-2, and IL3. In another embodiment, the semiconductor layer SC may extend (e.g. directly extend) without the source electrode SE and the drain electrode DE to be electrically connected to an adjacent pixel. The first data conductive layer SD1 may include aluminum (Al), silver (Ag), magnesium (Mg), chromium (Cr), nickel (Ni), calcium (Ca), molybdenum (Mo), titanium (Ti), tungsten (W), copper (Cu), and/or an alloy thereof, and may have a single-layered or multi-layered structure including the same. The first data conductive layer SD1 according to the embodiment may have a triple-layered structure in which an aluminum (Al) layer is disposed between two titanium (Ti) layers. Additional descriptions of the triple-layered structure of Ti/Al/Ti will be provided below.

The first organic insulating layer IL4 and the second organic insulating layer IL5 may be sequentially positioned on the third inorganic insulating layer IL3 and the first data conductive layer SD1. The first organic insulating layer IL4 and the second organic insulating layer IL5 may include an organic insulating material such as a general purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

A connecting member CE may be positioned between the first organic insulating layer IL4 and the second organic insulating layer IL5. The connecting member CE configures a second data conductive layer SD2, and may electrically connect the drain electrode DE to the first electrode AE1. The connecting member CE may electrically connect the first capacitor electrode CE1 or a gate electrode GE of the driving transistor T1 to another element. The opening for the connecting member (CE) to be electrically connected to the first organic insulating layer (IL4; also referred to as an additional organic film) may be the opening area 101. This portion may not be the organic film positioned below the first electrode (AE1; anode), but as shown in FIG. 20, it may be a metal layer positioned on the upper portion next to the second electrode (E2), so it may reflect, it may be processed as the opening area 101, and the added polarization portion 131 may correspond thereto. The second data conductive layer SD2 may include at least one of aluminum (Al), silver (Ag), magnesium (Mg), gold (Au), nickel (Ni), chromium (Cr), nickel (Ni), calcium (Ca), molybdenum (Mo), titanium (Ti), tungsten (W), and copper (Cu), and may have a single-layered or multi-layered structure including the same. The second data conductive layer SD2 according to the embodiment may have a triple-layered structure in which an aluminum (Al) layer is disposed between two titanium (Ti) layers. The second data conductive layer SD2 may have the same structure as the first data conductive layer SD1. Additional descriptions of the triple-layered structure of Ti/Al/Ti will be provided below.

A first electrode AEl may be positioned on the second organic insulating layer IL5. The first electrode AEl may configure a pixel electrode layer PXL, and may be electrically connected to the connecting member CE through a contact hole of the second organic insulating layer IL5. The opening (e.g. contact hole) of the second organic insulating layer IL5, which electrically connects the first electrode AEl to the connecting member CE, may correspond to the opening area 101, and the second organic insulating layer IL5 may correspond to the organic film, which defines the opening area 101. The first electrode AEl may be electrically connected to the drain electrode DE. For example, the first electrode AEl may be electrically connected to the drain electrode DE of the sixth transistor through the connecting member CE. The first electrode AE1 may include a metal such as silver (Ag), lithium (Li), calcium (Ca), aluminum (Al), magnesium (Mg), gold (Au), or an alloy thereof, and may include a transparent conductive oxide (TCO) such as an indium tin oxide (ITO) or an indium zinc oxide (IZO). The first electrode AEl may be made of a single layer including a metallic material or a transparent conductive oxide, or multi-layer including the above-mentioned materials. In the embodiment, the first electrode AEl may have a triple-layered structure of indium tin oxide (ITO)/silver (Ag)/indium tin oxide (ITO). Additional descriptions of the structure of ITO/Ag/ITO may be provided below.

The gate electrode GE and the semiconductor layer SC may form a polycrystalline transistor, and the oxide gate electrode OGE and the oxide semiconductor layer OSC may configure an oxide transistor. For example, a source electrode SE and a drain electrode DE may be electrically connected to the first region and the second region of the semiconductor layers SC and OSC. In another embodiment, the transistor may be configured with the gate electrode GE and the semiconductor layers SC and OSC without using the source electrode SE and the drain electrode DE. The transistor (e.g. sixth transistor T6) may be electrically connected to the first electrode AE1 to supply a current to the light emitting diode LED.

A pixel defining spacer HPDL may be positioned on the second organic insulating layer IL5 and the first electrode AE1. The pixel defining spacer HPDL may include a pixel defining layer IL6 and a spacer IL7 positioned on the second organic insulating layer IL5 and the first electrode AE1.

The pixel defining layer IL6 may have an opening overlapping at least part of the first electrode AE1 and defining the light emitting area LEA. The opening of the pixel defining layer IL6 may have a planar form or shape that is substantially similar to the first electrode AE1. The opening may have a rhombic shape or an octagonal shape that is similar to the rhombic shape in a plan view. The shapes of the opening are not limited thereto, and the opening of the pixel defining layer IL6 may have various shapes such as a quadrangle, a polygon, a circle, an oval, or other suitable shapes.

The pixel defining layer IL6 and the spacer IL7 may include an organic insulating material such as a general purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

An intermediate layer EL may be positioned on the pixel defining layer IL6, the spacer IL7, and the first electrode AE1. Referring to FIG. 20, the intermediate layer EL may include an emission layer EML and a function layer FL. The emission layer EML of the intermediate layer EL may generate a color light. The emission layer EML may include an organic material and/or an inorganic material. The emission layer EML may be formed in the opening of the pixel defining layer IL6. The function layer FL may include at least one of a hole injection layer (HIL), a hole transporting layer (HTL), an electron transporting layer (ETL), and an electron injection layer (EIL). The function layer FL may be divided into a first function layer FLI (refer to FIG. 18) positioned between the first electrode AE1 and the emission layer EML and a second function layer FL2 (refer to FIG. 18) positioned between the emission layer EML and the second electrode E2. The function layer FL may overlap the entire of the substrate SUB. The function layer FL may be disposed on pixels PX (e.g. refer to FIG. 19).

A second electrode E2 may be positioned on the intermediate layer EL. The second electrode E2 may include a reflective metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or an alloy thereof, or may include a transparent conductive oxide (TCO) such as an indium tin oxide (ITO) or an indium zinc oxide (IZO).

The first electrode AE1, the intermediate layer EL, and the second electrode E2 may configure a light emitting diode LED. The first electrode AE1 may be an anode that is a hole injection electrode, and the second electrode E2 may be a cathode that is an electron injection electrode. However, the embodiment is not limited thereto. For example, the first electrode AE1 may be a cathode, while the second electrode E2 may be an anode depending on methods for driving a light emitting display device.

Electrons injected into the organic intermediate layer EL from the first electrode AE1 and holes injected into the organic intermediate layer EL from the second electrode E2 may be combined to generate excitons in the emission layer EML. In case that the excitons fall to the ground state from the excited state, the emission layer EML may emit light.

Although not shown in FIG. 20, an encapsulation layer ENC (refer to FIG. 18) may be positioned on the second electrode E2. The encapsulation layer ENC (refer to FIG. 18) may cover (or overlap) an upper side and a lateral side of the light emitting diode LED and may seal the light emitting diode LED. The light-emitting device (e.g. the light emitting diode LED) may be vulnerable to moisture or oxygen, and the encapsulation layer ENC (refer to FIG. 18) may seal the light emitting diode LED to prevent an inflow of external moisture and oxygen. The encapsulation layer ENC (refer to FIG. 18) may include multiple layers. The encapsulation layer ENC (refer to FIG. 18) may be formed to be a complex film including an inorganic layer and an organic layer. For example, the encapsulation layer ENC (refer to FIG. 18) may be made of triple layers including a first inorganic encapsulation layer EIL1, an organic encapsulation layer EOL, and a second inorganic encapsulation layer EIL2, which are sequentially stacked.

An embodiment having a pixel structure described with reference to FIGS. 17 and 18 and the embodiment having a pixel structure described with reference to FIGS. 19 and 20 have been described. However, the disclosure is not limited thereto, and the display panel may have various pixel structures.

An embodiment of manufacturing process for forming an additional polarizer 130 is provided below with reference to FIG. 21.

Figure 21:
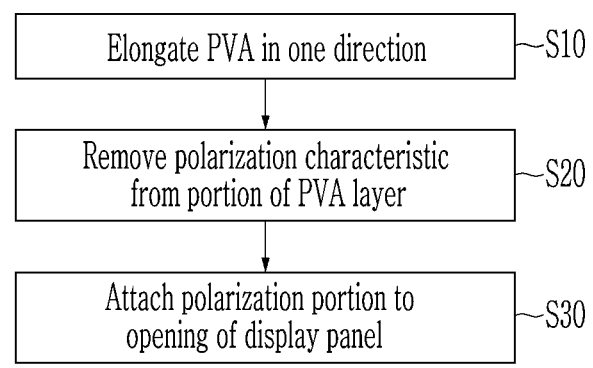
FIG. 21 shows a flowchart of manufacturing and attaching an additional polarizer in a method of manufacturing a light emitting display device according to an embodiment.

FIG. 21 shows a flowchart of a method for manufacturing an additional polarizer and attaching the same from among a method for manufacturing a light emitting display device according to an embodiment.

Referring to FIG. 21, a polyvinyl alcohol (PVA)-based material may be elongated in a direction ("elongation direction") to form an elongated PVA layer, and molecular chains may be aligned in a constant direction (S10). In case that the PVA-based material is elongated in a direction, the elongated PVA layer may have a polarization characteristic, in which an absorption axis is formed in the elongation direction. The elongated PVA layer may include a portion corresponding to an opening area 101 (e.g. refer to FIG. 2) and a remaining portion corresponding to a non-opening area 102 (e.g. refer to FIG. 2).

The polarization characteristic of the remaining portion of the elongated PVA layer, which corresponds to the non-opening area 102 (e.g. refer to FIG. 2) may be removed (S20). For example, the polarization characteristic may be removed (e.g., partially or selectively removed) from the elongated PVA layer except the portion thereof corresponding to the opening area 101 (e.g. refer to FIG. 2). The polarization characteristic may be partially (or selectively) removed from the elongated PVA layer through various methods. For example, the polarization characteristic may be removed by irradiating laser beams onto the remaining portion of the elongated PVA layer or rinsing the remaining portion of the elongated PVA layer by a solution such as iodine. For example, the portion of the elongated PVA layer, which corresponds to the opening area 101 (e.g. refer to FIG. 2) may be protected by masking during the process for partially removing the polarization characteristic. The region from which the polarization characteristic is removed is formed to be a non-polarization portion 132, and the portion in which the polarization characteristic is protected by masking and remains is formed to be a polarization portion 131. Thus, an additional polarizer 130 (e.g. refer to FIG. 2) including the polarization portion 131 (e.g. refer to FIG. 2) and the non-polarization portion 132 (e.g. refer to FIG. 2) may be formed.

A TAC film may be additionally attached to at least one side of the PVA layer to protect the polarization portion 131 (e.g refer to FIG. 2) and maintain the elongated state thereof, and thus, the polarization characteristic may maintain the elongated state.

The polarization portion 131 may be attached to an opening area 1010P of a display panel 100 (e.g. refer to FIG. 2) (S30). For example, the polarization portion 131 (e.g. refer to FIG. 2) and the non-polarization portion 132 (e.g. refer to FIG. 2) of the additional polarizer 130 (e.g. refer to FIG. 2) may be attached to the opening area 101 (e.g. refer to FIG. 2) and the non-opening area 102 (e.g. refer to FIG. 2) of the display panel 100 (e.g. refer to FIG. 2), respectively. A phase delay layer 110 (e.g. refer to FIG. 2) may be formed on the display panel 100 (e.g. refer to FIG. 2), and the polarization portion 131 (e.g. refer to FIG. 2) and the non-polarization portion 132 (e.g. refer to FIG. 2) of the additional polarizer 130 (e.g. refer to FIG. 2) may be attached to portions of the phase delay layer 110 (e.g. refer to FIG. 2), which correspond to the opening area 101 (e.g. refer to FIG. 2) and the non-opening area 102 (e.g. refer to FIG. 2), respectively.

According to the above-noted method, the additional polarizer may be generated and may be attached to the display panel.

While this disclosure has been illustrated and described with reference to the embodiments thereof, it will be apparent to those of skilled in the art that various changes and modifications in form and detail may be formed thereto without departing from the spirit and scope of the disclosure.

What is claimed is:

1. A light emitting display device comprising:
   a display panel including a light emitting area and a non-light emitting area;
   a phase delay layer disposed on an upper portion of the display panel; and
   a polarizer and an additional polarizer disposed on an upper portion of the phase delay layer, wherein the display panel includes:
      a first transistor disposed on a substrate;
      an organic film overlapping the first transistor and including an opening in a plan view;
      a first electrode disposed on the organic film;
      an emission layer disposed on the first electrode and disposed corresponding to the light emitting area; and
      a second electrode disposed on the emission layer,
   the first electrode, the emission layer, and the second electrode form a light emitting diode (LED),
   the additional polarizer includes:
      a polarization portion overlapping the opening of the organic film in a plan view; and
      a non-polarization portion disposed in a region where the polarization portion is not disposed, and
   the polarization portion is disposed in a portion of the non-light emitting area.

2. The light emitting display device of claim 1, wherein the first electrode is electrically connected to the first transistor through the opening of the organic film.

3. The light emitting display device of claim 2, wherein the display panel includes:
   an opening area in which the opening of the organic film is formed; and
   a non-opening area in which the opening of the organic film is not formed, and
   the polarization portion overlaps at least part of the opening area in a plan view.

4. The light emitting display device of claim 3, wherein the non-opening area includes the light emitting area.

5. The light emitting display device of claim 3, wherein the display panel further comprises:
   an additional organic film disposed on a lower portion of the organic film and having an opening included in the opening area; and
   a connecting member disposed in the opening of the additional organic film to electrically connect the first electrode to the first transistor.

6. The light emitting display device of claim 2, wherein the first transistor is a driving transistor applying an output current to the light emitting diode (LED).

7. The light emitting display device of claim 6, wherein the driving transistor includes a polycrystalline semiconductor.

8. The light emitting display device of claim 7, further comprising:
   a second transistor transmitting a data voltage to an input-side electrode of the driving transistor; and
   a third transistor electrically connecting a gate electrode of the driving transistor and an output-side electrode of the driving transistor.

9. The light emitting display device of claim 8, wherein the second transistor includes a polycrystalline semiconductor, and
   the third transistor includes an oxide semiconductor.

10. The light emitting display device of claim 1, wherein the additional polarizer is disposed on an upper portion of the phase delay layer, and
    the polarizer is disposed on the additional polarizer.

11. The light emitting display device of claim 1, wherein the polarizer is disposed on an upper portion of the phase delay layer, and
    the additional polarizer is disposed on the polarizer.

12. The light emitting display device of claim 1, wherein the polarization portion has an island shape, an extended shape extending in a direction, a zigzag shape, or a protruded shape, and
    the island shape has a polygonal shape, a circular shape, or a quadrangular shape.

13. The light emitting display device of claim 1, wherein the phase delay layer includes a $\lambda/4$ plate, and
    the $\lambda/4$ plate has a delay axis intersecting an absorption axis of the polarizer or an absorption axis of the polarization portion at about 45 degrees.

14. The light emitting display device of claim 1, wherein the phase delay layer includes a $\lambda/4$ plate and a $\lambda/2$ plate,
    the $\lambda/4$ plate has a delay axis intersecting an absorption axis of the polarizer or an absorption axis of the polarization portion at an angle equal to or greater than about 70 degrees and equal to or less than about 80 degrees, and
    the $\lambda/2$ plate has a delay axis intersecting the absorption axis of the polarizer or the absorption axis of the polarization portion at an angle equal to or greater than about 10 degrees and equal to or less than about 20 degrees.

15. The light emitting display device of claim 1, wherein the polarizer includes:
    a PVA (polyvinyl alcohol) layer in which PVA-based molecular chains are aligned in a direction to have a polarization characteristic; and a triacetyl cellulose (TAC) film disposed on sides of the PVA layer.

16. The light emitting display device of claim 1, wherein the display panel further includes an encapsulation layer overlapping the first transistor and the light emitting diode (LED) in a plan view, and the encapsulation layer includes triple layers formed by sequentially stacking a first inorganic encapsulation layer, an organic encapsulation layer, and a second inorganic encapsulation layer or is made of a glass encapsulation layer.

17. The light emitting display device of claim 16, wherein the display panel further includes a touch screen part disposed on an upper portion of the encapsulation layer and is capable of sensing a touch.

* * * * *